United States Patent
Chung et al.

(10) Patent No.: US 10,163,990 B2
(45) Date of Patent: Dec. 25, 2018

(54) DISPLAY DEVICE WITH CAMERA MODULE

(71) Applicant: Samsung Display Co., Ltd, Yongin-si, Gyeonggi-do (KR)

(72) Inventors: Yun-Mo Chung, Yongin-si (KR); Byung-Ik Kong, Gimhae-si (KR); Byoung-Ki Kim, Seoul (KR); Ho-Jin Yoon, Hwaseong-si (KR); Dae-Woo Lee, Hwaseong-si (KR); Jae-Beom Choi, Suwon-si (KR)

(73) Assignee: Samsung Display Co., Ltd. (KR)

( * ) Notice: Subject to any disclaimer, the term of this patent is extended or adjusted under 35 U.S.C. 154(b) by 33 days.

(21) Appl. No.: 15/263,223

(22) Filed: Sep. 12, 2016

(65) Prior Publication Data

US 2017/0277219 A1   Sep. 28, 2017

(30) Foreign Application Priority Data

Mar. 24, 2016   (KR) ........................ 10-2016-0035247

(51) Int. Cl.
| | |
|---|---|
| H04N 3/14 | (2006.01) |
| H01L 27/32 | (2006.01) |
| H04N 5/225 | (2006.01) |
| G06F 1/16 | (2006.01) |
| H01L 51/52 | (2006.01) |
| H04N 5/335 | (2011.01) |

(52) U.S. Cl.
CPC ........ *H01L 27/3234* (2013.01); *G06F 1/1637* (2013.01); *H01L 27/326* (2013.01); *H01L 51/529* (2013.01); *H01L 51/5284* (2013.01); *H04N 5/2257* (2013.01); *H01L 2227/323* (2013.01)

(58) Field of Classification Search
CPC ............... G06F 1/1605; H01L 51/5271; H01L 27/3234; H01L 27/3258; H01L 51/5237; H04N 5/2257
USPC .......................................... 348/373–374, 376
See application file for complete search history.

(56) References Cited

U.S. PATENT DOCUMENTS

| | | | | |
|---|---|---|---|---|
| 5,956,181 A | * | 9/1999 | Lin ........................... | B60R 1/12 359/630 |
| 6,747,723 B2 | * | 6/2004 | Hanakawa ........ | G02F 1/133555 349/114 |
| 7,532,276 B2 | * | 5/2009 | Sakai ................ | G02F 1/133514 349/106 |

(Continued)

*Primary Examiner* — Ngoc-Yen Vu
(74) *Attorney, Agent, or Firm* — Innovation Counsel LLP

(57) ABSTRACT

A display device includes a display panel, a camera module, and a heat sink plate. The display panel displays an image on a front surface, and includes a first substrate, a sub-pixel structure, and a reflection pattern. The display panel includes a plurality of pixel regions each having sub-pixel regions, a transparent region, and a reflection region surrounding the sub-pixel regions and the transparent region. The sub-pixel structure is disposed in the sub-pixel region. The second substrate is disposed on the sub-pixel structure. The reflection pattern is disposed on the second substrate, but not on the sub-pixel region and the transparent region. The camera module is disposed in a second surface on the display panel, and the second surface is opposite to the first surface. The heat sink plate is disposed between the display panel and the camera module, and has an opening that is aligned with the camera module.

36 Claims, 25 Drawing Sheets

(56) References Cited

U.S. PATENT DOCUMENTS

| | | | |
|---|---|---|---|
| 2009/0091669 A1* | 4/2009 | Wang | G02F 1/133707 349/37 |
| 2009/0096937 A1* | 4/2009 | Bauer | B60R 1/12 348/739 |
| 2014/0312321 A1* | 10/2014 | Yoo | H01L 27/3234 257/40 |

* cited by examiner

DISPLAY DEVICE WITH CAMERA MODULE

CROSS-REFERENCE TO RELATED APPLICATION(S)

This application claims priority under 35 USC § 119 to Korean Patent Applications No. 10-2016-0035247 filed on Mar. 24, 2016 in the Korean Intellectual Property Office (KIPO), the contents of which are incorporated herein in its entirety by reference.

BACKGROUND

1. Field

This disclosure relates generally to display devices. More particularly, embodiments of the present inventive concept relate to display devices including a reflection pattern.

2. Description of the Related Art

A flat panel display (FPD) device is widely used as a display device of an electronic device because the FPD device is lightweight and thin compared to a cathode-ray tube (CRT) display device. Typical examples of FPD devices are liquid crystal display (LCD) device and an organic light emitting display (OLED) device. Recently, a display device (e.g., the OLED device or the LCD device) capable of displaying an image and reflecting an image of an object that is located above the front of the display device may have been developed.

Meanwhile, the display device may include a camera module such that the functions of a video call and video conference, video recording, etc are operated using an image that is recorded by the camera module. Generally, the camera module is positioned in a border (or, edge) of the display device. However, the target object being recorded is usually closer to the center area of the display device. As such, the camera module may not squarely record the target object that is located above the front of the display device. The target object could appear off-center in the captured image or, in the case of a video conference, the captured image of a user shows the user looking "somewhere else," not at the camera because the user is looking at the display region (instead of at the border where the camera is). As a result, the captured image may be unnatural or unsatisfying.

SUMMARY

Some example embodiments provide a display device including a reflection pattern.

According to some aspect of example embodiments, a display device includes a display panel, a camera module, and a heat sink plate. The display panel displays an image on a front surface, and includes a plurality of pixel regions each having a sub-pixel region, a transparent region, and a reflection region surrounding the sub-pixel regions and the transparent region. The display panel has a first substrate, a sub-pixel structure that is disposed in the sub-pixel region on the first substrate, and a second substrate on the sub-pixel structure. The reflection pattern is disposed on the second substrate and includes openings in the sub-pixel region and the transparent region. The camera module is disposed in a back surface on the display panel that is opposite to the first surface. The heat sink plate is disposed between the display panel and the camera module, and has an opening that is aligned with the camera module.

In example embodiments, the display panel may further include a transflective reflection pattern on the second substrate.

In example embodiments, a thickness of the transflective reflection pattern may be less than a thickness of the reflection pattern, and a light transmissivity of the transflective reflection pattern may be greater than a light transmissivity of the reflection pattern.

In example embodiments, the reflection pattern and the transflective reflection pattern may be disposed between the second substrate and the sub-pixel structure, and the reflection pattern may be interposed between the second substrate and the transflective reflection pattern.

In example embodiments, the reflection pattern and the transflective reflection pattern may be disposed between the second substrate and the sub-pixel structure, and the transflective reflection pattern may be interposed between the second substrate and the reflection pattern.

In example embodiments, the reflection pattern and the transflective reflection pattern may be disposed on the back side of the second substrate, and the reflection pattern may be interposed between the second substrate and the transflective reflection pattern.

In example embodiments, the reflection pattern and the transflective reflection pattern may be disposed on the back side of the second substrate, and the transflective reflection pattern may be interposed between the second substrate and the reflection pattern.

In example embodiments, the second surface of the display panel may include a center region and a peripheral region surrounding the center region. The camera module may be positioned in the center region or the peripheral region.

In example embodiments, the camera module may be positioned in the center region.

In example embodiments, the camera module may obtain an image of an object that is located in front of the first surface of the display panel via the opening of the heat sink plate and the transparent region of the display panel.

In example embodiments, the camera module and the opening of the heat sink plate may have a circular cross-section.

In example embodiments, a diameter of the camera module may be the same as a diameter of the opening of the heat sink plate.

In example embodiments, the display device may further include a body surrounding the display panel, the heat sink plate, and the camera module.

In example embodiments, the body holds the camera module on the display panel

In example embodiments, the body may have a protrusion portion in a portion surrounding the camera module.

In example embodiments, the heat sink plate may further include a plurality of openings.

In example embodiments, the openings may be spaced apart from each other, and may be regularly arranged.

In example embodiments, the display device may further include a plurality of camera modules positioned in the respective openings.

In example embodiments, the display device may further include a body surrounding the display panel, the heat sink plate, and the camera modules. The body may fix the camera modules to the display panel, and may have a plurality of protrusion portions in a portion surrounding the camera modules each.

In example embodiments, the display device may further include a moving member. The moving member is coupled to the camera, and may move the camera module on the back surface on the display panel In example embodiments, the moving member may move the camera module such that the camera module is positioned on one of the openings in the heat sink plate.

In example embodiments, the display device may further include a body surrounding the display panel, the heat sink plate, the camera module, and the moving member.

In example embodiments, the sub-pixel structure may include a semiconductor element on the first substrate, a lower electrode on the semiconductor element, a light emitting layer on the lower electrode, and an upper electrode on the light emitting layer.

In example embodiments, the upper electrode may expose the transparent region.

In example embodiments, the semiconductor element may include an active layer, a gate electrode, a source electrode, and a drain electrode. The active layer may be disposed on the first substrate, and may include source and drain regions. The gate electrode may be disposed on the active layer. The source electrode may be disposed on the gate electrode, and may be in contact with the source region of the active layer. The drain electrode may be spaced apart from the source electrode, and may be in contact with the drain region of the active layer.

In example embodiments, the semiconductor element may further include a gate insulation layer, an insulating interlayer, and a planarization layer. The gate insulation layer may be disposed on the first substrate, and may cover the active layer in the sub-pixel region. The gate insulation layer may expose the transparent region. The insulating interlayer may be disposed on the gate insulation layer, and may cover the gate electrode in the sub-pixel region. The insulating interlayer may expose the transparent region. The planarization layer may be disposed on the insulating interlayer, and may cover the source and drain electrodes in the sub-pixel region. The planarization layer may expose the transparent region.

In example embodiments, the gate insulation layer, the insulating interlayer, and the planarization layer may not cover the front surface of the first substrate in the transparent region, and wherein a portion of the front surface of the first substrate that is not covered is a transparent window of the transparent region.

In example embodiments, the semiconductor element may further include a gate insulation layer, an insulating interlayer, and a planarization layer. The gate insulation layer may cover the active layer in the sub-pixel region, and may be disposed in the sub-pixel region and the transparent region on the first substrate. The insulating interlayer may cover the gate electrode in the sub-pixel region, and may be disposed in the sub-pixel region and the transparent region on the gate insulation layer. The planarization layer may be disposed on the insulating interlayer, and may cover the source and drain electrodes in the sub-pixel region. The planarization layer may expose the insulating interlayer in the transparent region.

In example embodiments, the semiconductor element may further include a gate insulation layer, an insulating interlayer, and a planarization layer. The gate insulation layer may cover the active layer in the sub-pixel region, and may be disposed in the sub-pixel region and the transparent region on the first substrate. The insulating interlayer may cover the gate electrode in the sub-pixel region, and may be disposed in the sub-pixel region and the transparent region on the gate insulation layer. The planarization layer may cover the source and drain electrodes in the sub-pixel region, and may be disposed in the sub-pixel region and the transparent region on the insulating interlayer.

In example embodiments, the heat sink may include a tab. The tab may include a first portion coupled to the heat sink plate and a second portion spaced apart from the heat sink plate, and may have a circular shape.

In example embodiments, at least a portion of the camera module may be positioned in the opening of the heat sink plate.

In another aspect, the inventive concept pertains to a display device that includes a display panel including a sub-pixel region, a transparent region, and a reflection region, and a camera module coupled to a back side of the display panel and aligned with the transparent region to capture an image of an object in front of the display panel.

The display device may further include a heat sink positioned between the display panel and the camera module, the heat sink having an opening that is aligned with the transparent region and the camera module, and an adhesive member between the display panel and the heat sink.

The display device may also include a transflective reflection pattern covering an entire surface of the display panel.

In yet another aspect, the display device includes a display panel, a camera module coupled to a back side of the display panel, and a moving member. The display panel has a plurality of pixel regions, each of the pixel regions including a sub-pixel region, a reflection region, and a transparent region. The moving member is coupled to the camera module to move the camera module into different pixel regions and align the camera module with the transparent region of a selected pixel region.

As the display device according to example embodiments includes the reflection pattern and transflective reflection pattern, the display panel including the transparent region, the camera module that is positioned in a lower surface on the display panel, and the heat sink plate having the opening that corresponds to the camera module, the display device may reflect or film an image of an object located above the front of the display device. Accordingly, although the heat sink plate is disposed in the display device, the display device may squarely film an image of an object located above the front of the display device.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
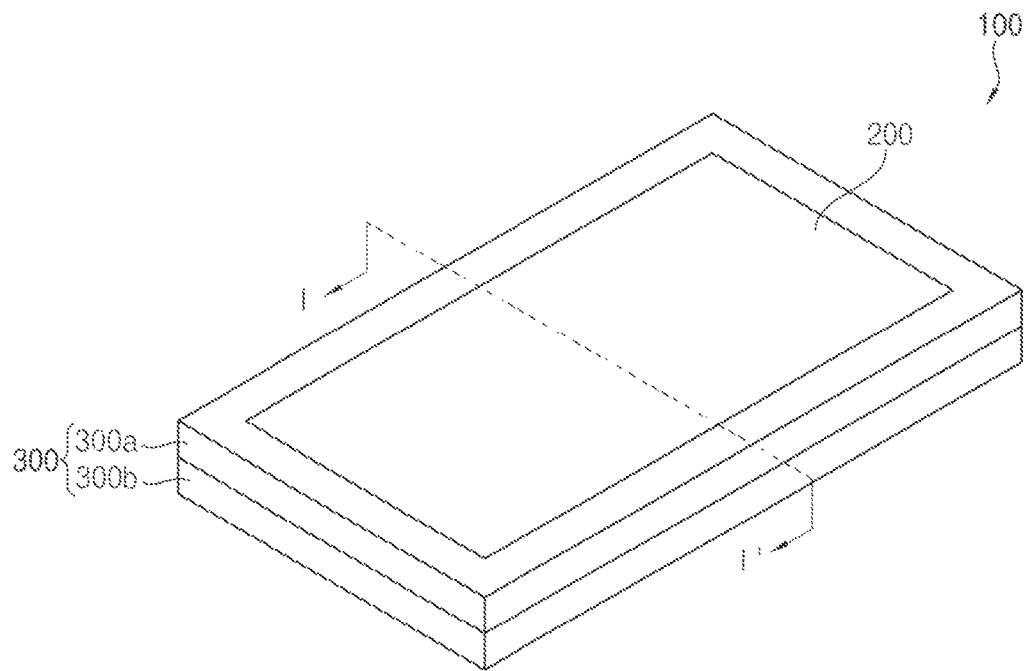
FIG. 1 is a perspective view illustrating a display device in accordance with example embodiments.
Figure 2:
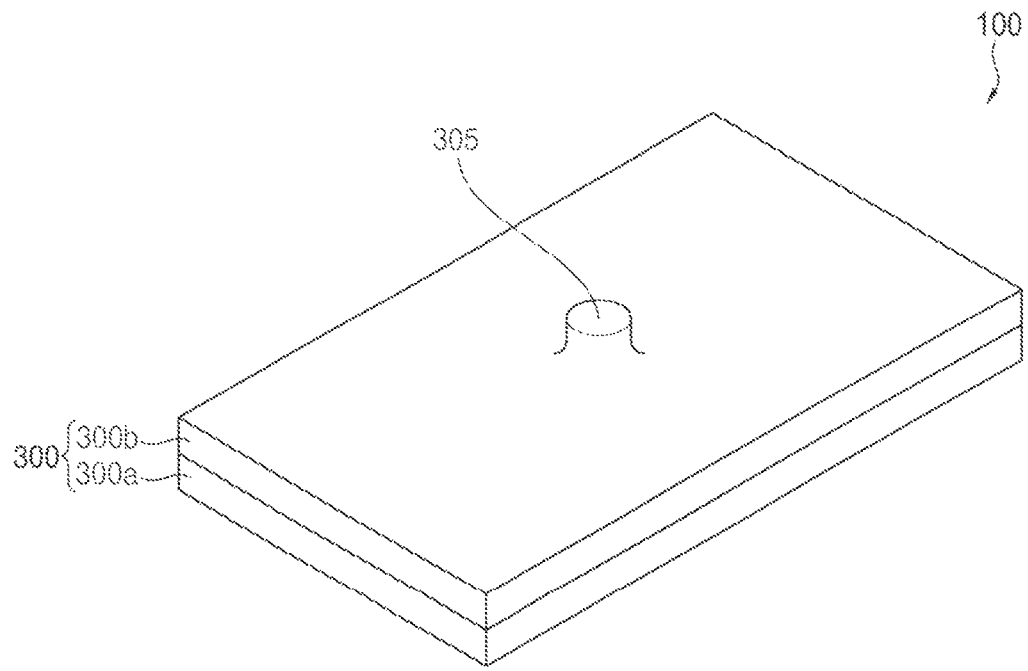
FIG. 2 is a perspective view illustrating a lower surface of the display device of FIG. 1.
Figure 3A:
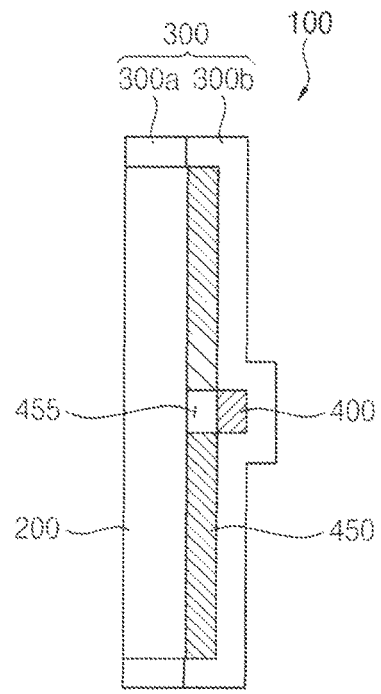
FIG. 3A is a cross-sectional view taken along a line I-I' of FIG. 1.
Figure 3B:
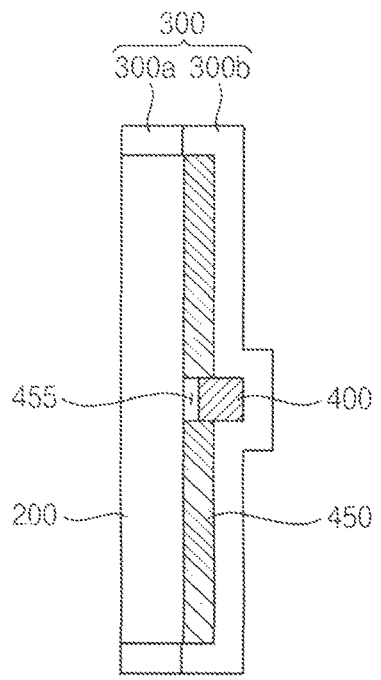
FIG. 3B is a cross-sectional view for describing an example of a camera module included in the display device of FIG. 2.
Figure 4:
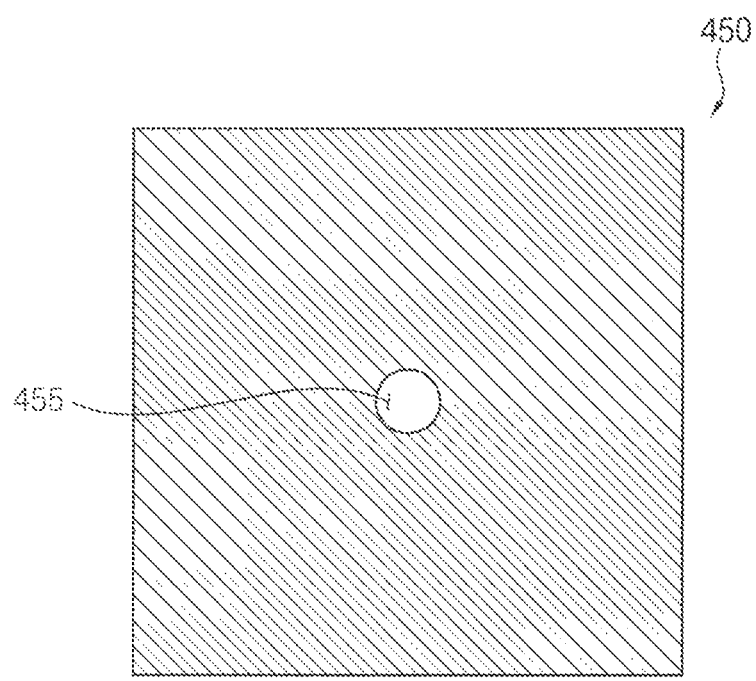
FIG. 4 is a planar view for describing a heat sink plate included in the display device of FIG. 3A.
Figure 5:
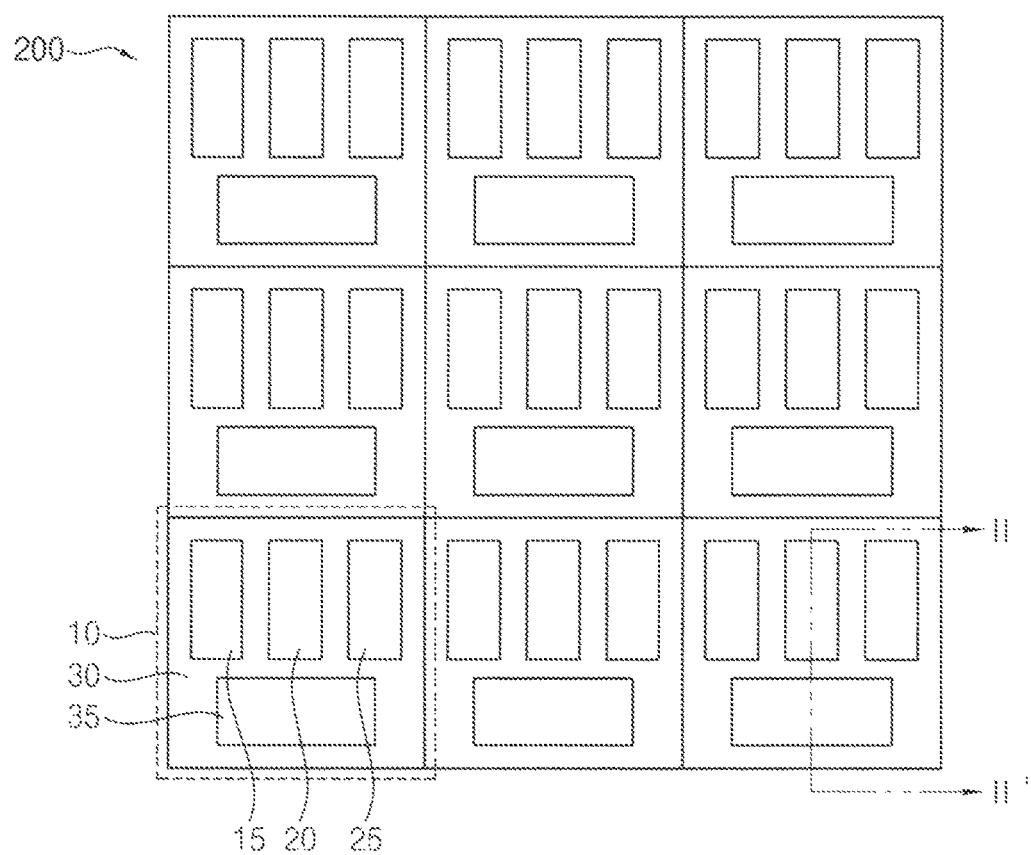
FIG. 5 is a planar view for describing a display panel included in the display device of FIG. 3A.
Figure 6:
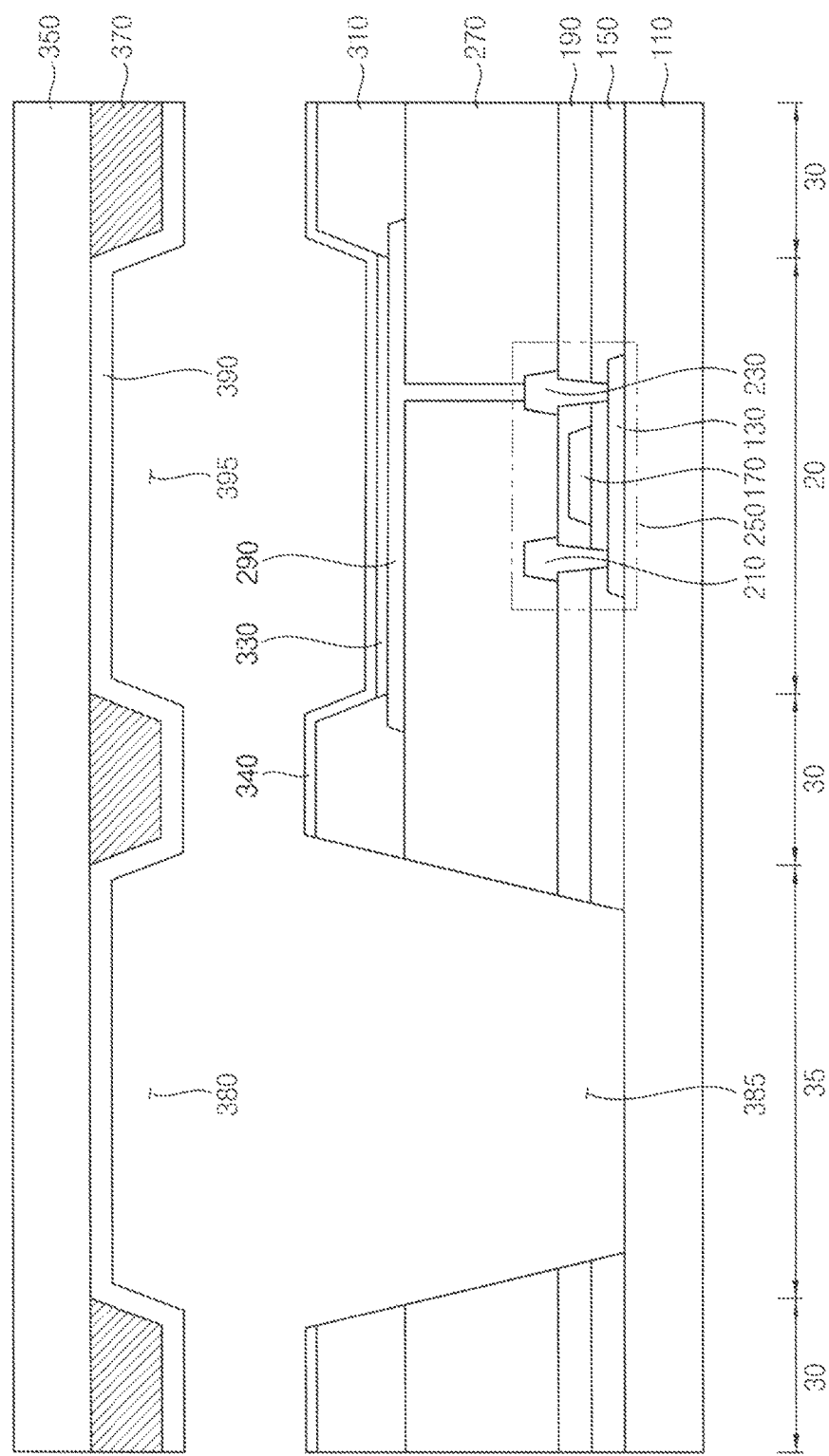
FIG. 6 is a cross-sectional view taken along a line II-II' of FIG. 5.

FIG. 1 is a perspective view illustrating a display device in accordance with example embodiments, and FIG. 2 is a perspective view illustrating a lower surface of the display device of FIG. 1. FIG. 3A is a cross-sectional view taken along a line I-I' of FIG. 1, and FIG. 3B is a cross-sectional view for describing an example of a camera module included in the display device of FIG. 2. FIG. 4 is a planar view for describing a heat sink plate included in the display device of FIG. 3A, and FIG. 5 is a planar view for describing a display panel included in the display device of FIG. 3A. FIG. 6 is a cross-sectional view take along a line II-IF of FIG. 5.

Referring to FIGS. 1, 2, 3, 4, 5, and 6, a display device 100 may include a display panel 200, a camera module 400, a heat sink plate 450, a body 300, etc. Here, the heat sink plate 450 may have an opening 455, and the display panel 200 may include a first substrate 110, a sub-pixel structure, a second substrate 350, a reflection pattern 370, a transflective reflection pattern 390, etc. In example embodiments, the display panel 200 may include a plurality of pixel regions 10. One pixel region 10 among a plurality of the pixel regions 10 may include first, second, and third sub-pixel regions 15, 20, and 25, a transparent region 35, and a reflection region 30. As the display device 100 includes the reflection region 30, the display device 100 may reflect an image of an object that is located in front of the display device 100. In addition, as the display device 100 includes the transparent region 35 and the opening 455, the camera module 400 may capture an image of an object that is located in front of the display device 100 via the transparent region 35 and the opening 455.

Referring again to FIGS. 1, 2, and 3, the heat sink plate 450 may be interposed between the display panel 200 and the camera module 400, and the display panel 200 and the body 300 may surround the camera module 400 and the heat sink plate 450. FIG. 1 depicts what is herein referred to as the "front" of the display device 100. The display panel 200 is framed by the body 300, so that the images shown on the display panel 200 may be viewed. FIG. 2 depicts what is herein referred to as the "back" of the display device 100. The back of the display device 100 is covered by the body 300 and has a protrusion portion 305. The protrusion portion 305 accommodates a camera module, as will be described below.

A first surface of the display panel 200, which is the "front" part of the display device 100, may display an image. A second surface of the display panel 200, which is opposite the first surface, may be in contact with the heat sink plate 450. Referring to FIG. 3A and FIG. 3B, the left side is herein referred to as the "front" side, and the right side is herein referred to as the "back." As illustrated in FIG. 5, the display device 100 may include a plurality of pixel regions 10. One pixel region 10 among a plurality of the pixel regions 10 may include the first, second, and third sub-pixel regions 15, 20, and 25, the transparent region 35, and the reflection region 30. For example, a plurality of the pixel regions 10 each may have the first, second, and third sub-pixel regions 15, 20, and 25, the transparent region 35, and the reflection region 30. The reflection region 30 may substantially surround the first, second, and third sub-pixel regions 15, 20, and 25 and the transparent region 35. In example embodiments, each pixel region 10 may have its own transparent region 35. However, this is not a limitation of the inventive concept. For example, in some example embodiments, a plurality of pixel regions 10 may share one transparent region 35 that extends across neighboring pixel regions 10.

Referring again to FIG. 5, first, second, and third sub-pixels may be disposed in the first, second, and third sub-pixel regions 15, 20, and 25, respectively. For example, the first sub-pixel may emit light of a red color, and second sub-pixel may emit light of a green color. In addition, the third sub-pixel may emit light of a blue color. The first, second, and third sub-pixels (e.g., sub-pixel structure) may be located at the same level on the first substrate 110.

The reflection pattern 370 may be disposed in the reflection region 30. For example, the reflection pattern 370 may reflect external light, and may have a plate shape that has a mesh structure including a plurality of openings. The reflection pattern 370 may include openings that are located in the first, second, and third sub-pixel regions 15, 20, and 25 and transparent region 35. A size of the first, second, and third sub-pixel regions 15, 20, and 25 each may be substantially the same as that of the openings each of the reflection pattern 370.

A transparent window 385 may be located in the transparent region 35. The camera module 400 that is positioned on the second surface of the display panel 200 may obtain an image of an object that is located above the first surface of the display panel 200 via the transparent region 35. That is, the transparent region 35 may be transparent, and the sub-pixel structure may not be disposed in the transparent region 35. As illustrated in FIG. 6, the display device 100 may include the first substrate 110, the sub-pixel structure, the second substrate 350, the reflection pattern 370, the transflective reflection pattern 390, etc. Here, the sub-pixel structure may include a semiconductor element 250, a lower electrode 290, a pixel defining layer 310, a light emitting structure 330, and an upper electrode 340. In addition, the semiconductor element 250 may include an active layer 130, a gate insulation layer 150, a gate electrode 170, an insulating interlayer 190, a source electrode 210, a drain electrode 230, and a planarization layer 270.

Referring again to FIG. 6, as described above, the display device 100 may include a plurality of pixel regions 10. One pixel region 10 among a plurality of the pixel regions 10 may include the sub-pixel region 20, the reflection region 30, and the transparent region 35. The semiconductor element 250, the lower electrode 290, the light emitting structure 330, etc may be disposed in the sub-pixel region 20. The pixel defining layer 310, the reflection pattern 370, etc may be disposed in the reflection region 30. The transparent window 385 may be located in the transparent region 35. The transflective reflection pattern 390 may be disposed in the sub-pixel region 20, the reflection region 30, and the transparent region 35. Referring to FIG. 6, the top portion of the figure is the "front" of the display device 100, such that the heat sink 450 and the camera module 400 would be positioned close to the bottom portion of FIG. 6.

For example, an image may be displayed in the sub-pixel region 20, and an image of an object that is located in front of the display device 100 may be reflected in the reflection region 30. As the display device 100 includes the reflection pattern 370 and the transflective reflection pattern 390, the display device 100 may serve as a mirror display device. In addition, the display device 100 may serve as a display device having the camera module 400 capable of squarely capturing an image of an object that is located in the front of the display device 100 via the transparent region 35. Accordingly, the camera module 400 of the display device 100 may obtain an image of a user "looking at" the camera.

The first substrate 110 may be provided. The first substrate 110 may be formed of transparent materials. For example, the first substrate 110 may include a quartz substrate, a synthetic quartz substrate, a calcium fluoride substrate, a fluoride-doped quartz substrate, a sodalime glass substrate, a non-alkali substrate etc. Alternatively, the first substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the sub-pixel structure. That is, the first substrate 110 may have a structure in which the first polyimide layer, the barrier film layer and the second polyimide layer are stacked on the rigid glass substrate. In manufacturing the display device 100, after an insulating layer (e.g., a buffer layer) is provided on the second polyimide layer of the polyimide substrate, the sub-pixel structure may be disposed on the insulating layer. After the sub-pixel structure is formed on the insulating layer, the rigid glass substrate under which the polyimide substrate is disposed may be removed. It may be difficult to form the sub-pixel structure directly on the polyimide substrate because the polyimide substrate is relatively thin and flexible. Accordingly, the sub-pixel structure is formed on the polyimide substrate and the rigid glass substrate, and then the polyimide substrate may serve as the first substrate 110 of the display device 100 after the removal of the rigid glass substrate. As the display device 100 includes the sub-pixel region 20, reflection region 30, and transparent region 35, the first substrate 110 may also include the sub-pixel region 20, the reflection region 30, and the transparent region 35.

A buffer layer (not shown) may be disposed on the first substrate 110. The buffer layer may be disposed on the entire first substrate 110. The buffer layer may prevent the diffusion of metal atoms and/or impurities from the first substrate 110 into the sub-pixel structure. Additionally, the buffer layer may control a rate of a heat transfer in a crystallization process for forming the active layer 130, thereby obtaining a substantially uniform active layer. Furthermore, the buffer layer may improve a surface flatness of the first substrate 110 when a surface of the first substrate 110 is relatively irregular. According to a type of the first substrate 110, at least two buffer layers may be provided on the first substrate 110, or the buffer layer may not be disposed. For example, the buffer layer may include organic materials or inorganic materials.

The active layer 130 may be disposed in the sub-pixel region 20 on the first substrate 110, and may include source and drain regions. The active layer 130 may be formed of an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the sub-pixel region 20 on the first substrate 110, and may expose the transparent region 35. That is, the gate insulation layer 150 may not be disposed in the transparent region 35 on the first substrate 110. In example embodiments, the gate insulation layer 150 may sufficiently cover the active layer 130 in the sub-pixel region 20, and may have a substantially even surface without a step around the active layer 130. Alternatively, the gate insulation layer 150 may cover the active layer 130 in the sub-pixel region 20, and may be disposed as a substantially uniform thickness along a profile of the active layer 130. The gate insulation layer 150 may include a silicon compound, a metal oxide, etc.

The gate electrode 170 may be disposed on the gate insulation layer 150. The gate electrode 170 may be disposed on the active layer 130 in the sub-pixel region 20 with a gate insulating layer 150 interposed between the active layer 130 and the gate electrode 170. The gate electrode 170 may include a metal, a metal alloy, metal nitride, conductive metal oxide, transparent conductive materials, etc. These may be used alone or in a suitable combination thereof. Alternatively, the gate electrode 170 may have a multilayer structure.

The insulating interlayer 190 may be disposed on the gate electrode 170. The insulating interlayer 190 may cover the gate electrode 170 in the sub-pixel region 20 on the gate insulation layer 150, and may expose the transparent region 35. That is, the insulating interlayer 190 may not be disposed in the transparent region 35 on the first substrate 110. In example embodiments, the insulating interlayer 190 may sufficiently cover the gate electrode 170 in the sub-pixel region 20, and may have a substantially even surface without a step around the gate electrode 170. Alternatively, the insulating interlayer 190 may cover the gate electrode 170 in the sub-pixel region 20, and may be disposed as a substantially uniform thickness along a profile of the gate electrode 170. The insulating interlayer 190 may include a silicon compound, a metal oxide, etc.

The source electrode 210 and the drain electrode 230 may be disposed in the sub-pixel region 20 on the insulating interlayer 190. The source electrode 210 may be in contact with the source region of the active layer 130 via a contact hole formed by removing a portion of the gate insulation layer 150 and the insulating interlayer 190 each. The drain electrode 230 may be in contact with the drain region of the active layer 130 via a contact hole formed by removing a portion of the gate insulation layer 150 and the insulating interlayer 190 each. Each of the source electrode 210 and the drain electrode 230 may include a metal, an alloy, metal nitride, conductive metal oxide, transparent conductive materials, etc. These may be used alone or in a suitable combination thereof. Alternatively, each of the source electrode 210 and the drain electrode 230 may have a multilayer structure. Accordingly, the semiconductor element 250 including the active layer 130, the gate insulation layer 150, the gate electrode 170, the insulating interlayer 190, the source electrode 210, and the drain electrode 230 may be disposed.

In example embodiments, the semiconductor element 250 of the display device 100 has a top gate structure, although the inventive concept is not limited thereto. For example, in some example embodiments, the semiconductor element 250 may have a bottom gate structure. In addition, the semiconductor element 250 of the display device 100 is disposed in the sub-pixel region 20, although the inventive concept is not limited thereto. For example, the semiconductor element 250 may be disposed in the reflection region 30.

The planarization layer 270 may be disposed on the source electrode 210 and the drain electrode 230. The planarization layer 270 may cover the source electrode 210 and the drain electrode 230 in the sub-pixel region 20 on the insulating interlayer 190, without covering the transparent region 35. That is, the planarization layer 270 may not be disposed in the transparent region 35 on the first substrate 110. In example embodiments, the planarization layer 270 may be disposed as a relatively high thickness to sufficiently cover the source electrode 210 and the drain electrode 230 in the sub-pixel region 20. In this case, the planarization layer 270 may have a substantially even upper surface, and a planarization process may be further performed on the planarization layer 270 to implement the even upper surface of the planarization layer 270. Alternatively, the planarization layer 270 may cover the source electrode 210 and the drain electrode 230 in the sub-pixel region 20, and may be disposed at a substantially uniform thickness along a profile of the source electrode 210 and the drain electrode 230. The planarization layer 270 may include organic materials or inorganic materials. For example, the planarization layer 270 may include inorganic materials such as silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. Alternatively, the planarization layer 270 may include organic materials such as a photoresist, a polyacryl-based resin, a polyimide-based resin, a polyamide-based resin, a siloxane-based resin, an acryl-based resin, an epoxy-based resin, etc.

The lower electrode 290 may be disposed in the sub-pixel region 20 on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. Alternatively, the lower electrode 290 may have a multi-layered structure.

The pixel defining layer 310 may be disposed in the reflection region 30 on the planarization layer 270, and may expose a portion of the lower electrode 290. In addition, the pixel defining layer 310 may expose the transparent region 35. That is, the pixel defining layer 310 may not be disposed in the transparent region 35 on the first substrate 110. The light emitting layer 330 may be disposed in the portion of the lower electrode 290 that is exposed by the pixel defining layer 310 in the sub-pixel region 20. As the gate insulation layer 150, the insulating interlayer 190, the planarization layer 270, and the pixel defining layer 310 are removed in the transparent region 35, the transparent window 385 may be formed. The pixel defining layer 310 may be formed of organic materials or inorganic materials. Alternatively, the transparent window 385 may not be formed in the transparent region 35 of the display device 100. For example, the gate insulation layer 150, the insulating interlayer 190, the planarization layer 270, the pixel defining layer 310, and the upper electrode 340 may be disposed in the transparent region 35, and metal wirings (e.g., scan signal wirings, data signal wirings, initialization signal wirings, emission signal wirings, power supply voltage wiring, etc) and the semiconductor element 250 may not be disposed in the transparent region 35.

The light emitting layer 330 may be disposed on a portion of the lower electrode 290 that is exposed by the pixel defining layer 310. The light emitting layer 330 may have a multi-layered structure including an emission layer (EL), a hole injection layer (HIL), a hole transfer layer (HTL), an electron transfer layer (ETL), an electron injection layer (EIL), etc. The HIL, the HTL, the EL, the ETL, and the EIL may be sequentially disposed between the lower electrode 290 and the upper electrode 340. The EL of the light emitting layer 330 may be formed using at least one of light emitting materials capable of generating different colors of light (e.g., a red color of light, a blue color of light, and a green color of light, etc). In some example embodiments, the HIL, the HTL, the ETL, the EIL, etc except the EL may be disposed in the transparent region 35.

Alternatively, the EL of the light emitting layer 330 may generally generate white light by stacking a plurality of light emitting materials capable of generating different colors of light such as a red color of light, a green color of light, a blue color of light, etc. In this case, a color filter may be disposed on the light emitting layer 330 (e.g., the color filter overlaps the light emitting layer 330). The color filter may include at least one selected from a red color filter, a green color filter, and a blue color filter. Alternatively, the color filter may include a yellow color filter, a cyan color filter, and a magenta color filter. The color filter may include a photosensitive resin (or color photoresist), etc.

The upper electrode 340 may be disposed on the pixel defining layer 310 and the light emitting layer 330, and may not be disposed in the transparent region 35. Especially if the upper electrode 340 is not transparent, its absence from the transparent region 35 increases the overall transmissivity of the display device 100. The upper electrode 340 may include a metal, a metal alloy, metal nitride, conductive metal oxide, transparent conductive materials, etc. These may be used alone or in a suitable combination thereof. Alternatively, the upper electrode 340 may have a multi-layered structure.

The reflection pattern 370 may be disposed in the reflection region 30 covering the upper electrode 340. The reflection pattern 370 may be disposed on the back surface (the lower surface referring to FIG. 6) of the second substrate

350. The reflection pattern 370 may substantially surround the sub-pixel region 20 and the transparent region 35, and may cover the entire back surface of the second substrate 350. In addition, the reflection pattern 370 may have openings 380 and 395. The opening 380 may be located such that the opening 380 is in (e.g., aligns with) the sub-pixel region 20, and the opening 395 is in the transparent region 35. The reflection pattern 370 may generally resemble a plate including a mesh structure that is spatially divided by the openings 380 and 395.

The reflection pattern 370 may include a first surface and a second surface that is opposite the first surface. The first surface of the reflection pattern 370 may be in contact with the second substrate 350, and the second surface of the reflection pattern 370 may be in contact with the transflective reflection pattern 390.

A light incident through the second substrate 350 from an outside may be reflected from the first surface of the reflection pattern 370 (e.g., an image of an object that is located above the front of the display device 100 may be displayed on the first surface of the reflection pattern 370.). In addition, light generated from the light emitting layer 330 of the display device 100 may pass through the opening 395 located in the sub-pixel region 20. Meanwhile, the camera module 400 that is positioned on the second surface of the display panel 200 may record an image of an object that is located in front of the display device 100 via the openings 380 located in the transparent region 35.

The reflection pattern 370 may include a material that has relatively high reflective index. For example, the reflection pattern 370 may include gold (Au), silver (Ag), aluminum (Al), platinum (Pt), nickel (Ni), titanium (Ti), etc. Alternatively, the reflection pattern 370 may be formed of a metal, a metal alloy, metal nitride, conductive metal oxide, transparent conductive materials, etc. For example, the reflection pattern 370 may be formed of an alloy of aluminum, aluminum nitride (AlNx), an alloy of silver, tungsten nitride (WNx), an alloy of copper, chrome nitride (CrNx), an alloy of molybdenum, titanium nitride (TiNx), tantalum (Ta), tantalum nitride (TaNx), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

In example embodiments, the reflection pattern 370 of the display device 100 includes a single layer. However, this is not a limitation of the inventive concept. For example, in some example embodiments, the reflection pattern 370 may have a multi layer structure having a plurality of layers.

The transflective reflection pattern 390 may cover the second substrate 350 and the reflection pattern 370 on the second substrate 350 and the reflection pattern 370, and may be disposed on the entire lower surface of the second substrate 350. That is, the reflection pattern 370 and the transflective reflection pattern 390 may be disposed between the second substrate 350 and the sub-pixel structure, and the reflection pattern 370 may be interposed between the second substrate 350 and the transflective reflection pattern 390. The transflective reflection pattern 390 may transmit a portion of light and may reflect a remaining portion of the light. For example, a thickness of the transflective reflection pattern 390 may be less than that of the reflection pattern 370, and a light transmissivity of the transflective reflection pattern 390 may be greater than that of the reflection pattern 370. In addition, the transflective reflection pattern 390 may prevent a diffraction phenomenon of light capable of being generated from the reflection pattern 370 having a plurality of openings 380 and 395. Accordingly, the display device 100 may serve as a mirror display device offering improved visibility of the display device 100. For example, the transflective reflection pattern 390 may include Au, Ag, Al, Pt, Ni, Ti, etc. Alternatively, the transflective reflection pattern 390 may be formed of a metal, a metal alloy, metal nitride, conductive metal oxide, transparent conductive materials, etc.

In example embodiments, the transflective reflection pattern 390 of the display device 100 has a single layer. For example, in some example embodiments, the transflective reflection pattern 390 may have a multi layer structure having a plurality of layers.

The second substrate 350 may be disposed on the reflection pattern 370 and the transflective reflection pattern 390. The second substrate 350 and the first substrate 110 may include substantially the same materials. For example, the second substrate 350 may include quartz, synthetic quartz, calcium fluoride, fluoride-doped quartz, sodalime glass substrate, non-alkali glass etc. In some example embodiments, the second substrate 350 may include a transparent inorganic material or flexible plastic. For example, the second substrate 350 may include a flexible transparent resin substrate. In this case, to increase flexibility of the display device 100, the second substrate 350 may include a stacked structure where at least one organic layer and at least one inorganic layer are alternately stacked.

Referring again to FIGS. 1, 2, and 3, the camera module 400 may be positioned on the second surface of the display panel 200. For example, the second surface of the display panel 200 may include a center region and a peripheral region surrounding the center region. The camera module 400 may be positioned in the center region or the peripheral region. In example embodiments, the camera module 400 may be positioned in the center region of the display panel 200. The camera module 400 obtains an image of an object that is located above the first surface of the display panel 200 via the opening 455 of the heat sink plate 450 and the transparent region 35 of the display panel 200. That is, the camera module 400 may squarely capture the image of the object. For example, the position of eyes of a user of the display device 100 may exactly correspond to a position of the camera module 400, such that the user is "looking at" the camera.

The heat sink plate 450 may be positioned in the second surface on the display panel 200. For example, the heat sink plate 450 may be disposed between the display panel 200 and the camera module 400. As the heat sink plate 450 is disposed in the second surface of the display panel 200, a heat generated in the display panel 200 may be cooled. When the heat generated in the display panel 200 is not cooled, a performance of the sub-pixel structure included in the display panel 200 may be reduced and a lifetime of the sub-pixel structure may be decreased. As illustrated in FIG. 4, the heat sink plate 450 may have the opening 455. The opening 455 of the heat sink plate 450 may be located in the center region. In example embodiments, the opening 455 may overlap the camera module 400. For example, a shape of the opening 455 may have a planar shape of a circle, and a shape of the camera module 400 may have a planar shape of a circle. That is, a diameter of the camera module 400 may be substantially the same as that of the opening 455. In example embodiments, a diameter of the camera module 400 and the opening 455 each may be about 3 millimeters. Alternatively, as illustrated in FIG. 3B, at least a portion of the camera module 400 may be positioned in the opening 455. The heat sink plate 450 may include a material that has relatively high heat conductivity. For example, the heat sink plate 450 may include a metal, a metal alloy, etc. For example, the heat sink plate 450 may include Al, an alloy of aluminum, Ag, an alloy of silver, W, Cu, an alloy of copper, Ni, Cr, Mo, an alloy of molybdenum, Ti, Pt, Ta, Nd, Sc, etc. These may be used alone or in a suitable combination. In some example embodiments, the display device 100 may further include an adhesive member between the display panel 200 and the heat sink plate 450. The adhesive member may be substantially transparent. The adhesive member may be entirely disposed between the display panel 200 and the heat sink plate 450. On the other hand, the adhesive member may be disposed between the display panel 200 and the heat sink plate 450 except a portion that corresponds to the opening 455 of the heat sink plate 450. That is, the adhesive member may include an opening that overlaps the opening 455 of the heat sink plate 450. For example, the adhesive member may include an optical clear adhesive (OCA), a pressure sensitive adhesive (PSA), etc. Alternatively, the adhesive member may include a material that has a lower viscosity. In addition, the adhesive member may include a material that has relatively high heat conductivity and an adhesive property. Accordingly, the display panel 200 and the heat sink plate 450 may be attached to each other.

In example embodiments, the camera module 400 and the opening 455 each has a circular shape, although this is not a limitation. For example, the camera module 400 and the opening 455 each may have a planar triangle shape, a substantially diamond shape, a substantially polygonal shape, a substantially square shape, a substantially athletic track shape, or a substantially elliptical shape.

The body 300 may surround the display panel 200, the heat sink plate 450, and the camera module 400. The body 300 may include a front frame 300a and a back frame 300b. As the front frame 300a and the back frame 300b are combined, the display device 100 including the display panel 200, the heat sink plate 450, and the camera module 400 may be provided. In example embodiments, the body 300 may fix the camera module 400 that is positioned in the second surface on the display panel 200. For example, the body 300 may have a protrusion portion 305 in a portion (e.g., in the lower frame 300b) where the camera module 400 is surrounded. The front and back frames 300a and 300b of the body 300 may protect the display panel 200, the camera module 400, the heat sink plate 450, etc. For example, when the display device 100 is used, the body 300 may absorb an impact to the display device 100 even when the display device 100 is dropped or an external impact is applied thereto. The body 300 may include synthetic resin or metal (e.g., stainless steel, titanium, etc).

The display device 100 in accordance with example embodiments includes the reflection pattern 370 and the transflective reflection pattern 390, the display panel 200 including the transparent window 385 of the transparent region 35, the camera module 400 that is positioned next to a second surface on the display panel 200, and the heat sink plate 450 having the opening 455 that corresponds to the camera module 400, the display device 100 may reflect an image of an object located in front of the display device 100. Accordingly, although the heat sink plate 450 is disposed in the display device 100, the display device 100 may squarely capture an image of an object located in front of the display device 100.

Figure 15A:
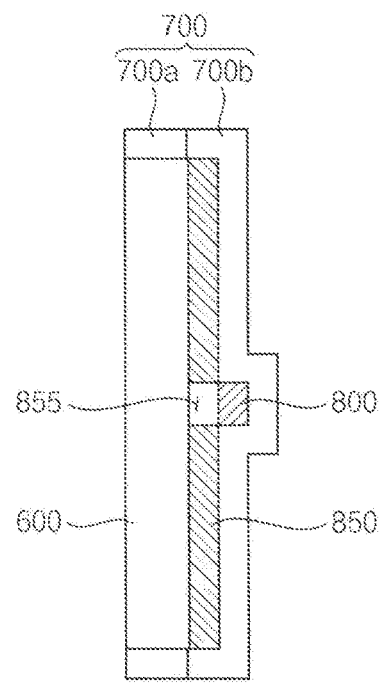
Figure 15B:
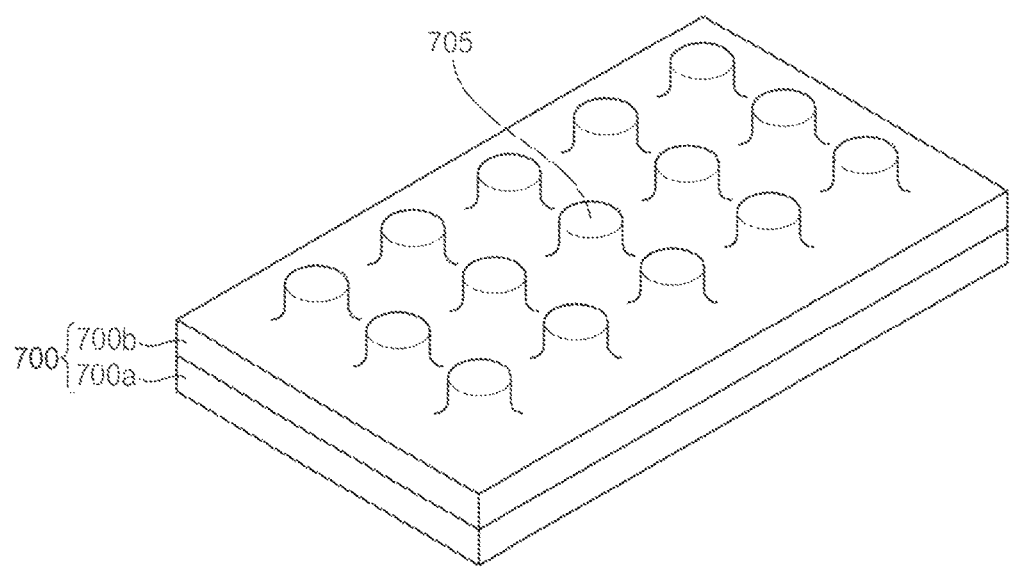
FIG. 15B is a perspective view illustrating an example of a protrusion portion included in the display device of FIG. 15B.

FIGS. 7, 8, 9, 10, 11, 12, 13, 14, and 15B are cross-sectional views illustrating a method of manufacturing a display device in accordance with example embodiments, and FIG. 15B is a perspective view illustrating an example of a protrusion portion included in the display device of FIG. 15A.

Figure 7:
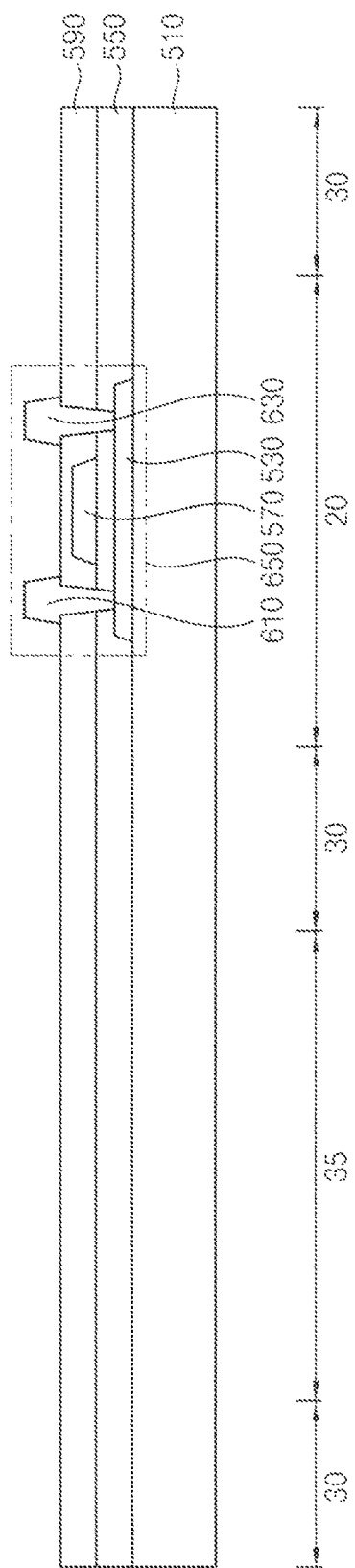
FIGS. 7, 8, 9, 10, 11, 12, 13A, 14, and 15A are cross-sectional views illustrating a method of manufacturing a display device in accordance with example embodiments.

Referring to FIG. 7, a first substrate 510 may be provided. The first substrate 510 may be formed of one or more transparent materials. For example, the first substrate 510 may be formed using a quartz substrate, a synthetic quartz substrate, a calcium fluoride substrate, a fluoride-doped quartz substrate, a sodalime glass substrate, a non-alkali substrate etc. Alternatively, the first substrate 510 may be formed of a flexible transparent material such as a flexible transparent resin substrate (e.g., a polyimide substrate).

A buffer layer (not shown) may be formed on the first substrate 510. The buffer layer may be formed on the entire first substrate 510. The buffer layer may prevent the diffusion of metal atoms and/or impurities from the first substrate 510 into a sub-pixel structure. Additionally, the buffer layer may control a rate of a heat transfer in a crystallization process for forming an active layer, thereby obtaining a substantially uniform active layer. Furthermore, the buffer layer may improve a surface flatness of the first substrate 510 when a surface of the first substrate 510 is relatively irregular. For example, the buffer layer may be formed using organic materials or inorganic materials.

An active layer 530 may be formed in a sub-pixel region 20 on the first substrate 510, and may include source and drain regions. The active layer 530 may be formed using an oxide semiconductor, an inorganic semiconductor (e.g., amorphous silicon, polysilicon, etc.), an organic semiconductor, etc.

A gate insulation layer 550 may be formed on the active layer 530. The gate insulation layer 550 may cover the active layer 530 in the sub-pixel region 20 on the first substrate 510, and may be formed on the entire first substrate 510. In example embodiments, the gate insulation layer 550 may sufficiently cover the active layer 530 in the sub-pixel region 20, and may have a substantially even surface without a step around the active layer 530. Alternatively, the gate insulation layer 550 may cover the active layer 530 in the sub-pixel region 20, and may be formed as a substantially uniform thickness along a profile of the active layer 530. The gate insulation layer 150 may be formed using a silicon compound, a metal oxide, etc.

A gate electrode 570 may be formed on the gate insulation layer 550 to overlap the active layer 530. The gate electrode 570 may be formed using a metal, a metal alloy, metal nitride, conductive metal oxide, transparent conductive materials, etc. These may be used alone or in a suitable combination thereof. Alternatively, the gate electrode 570 may have a multilayer structure.

An insulating interlayer 590 may be formed on the gate electrode 570. The insulating interlayer 590 may cover the gate electrode 570 in the sub-pixel region 20 on the gate insulation layer 550, and may be formed on the entire gate insulation layer 550. In example embodiments, the insulating interlayer 590 may sufficiently cover the gate electrode 570 in the sub-pixel region 20, and may have a substantially even surface without a step around the gate electrode 570. Alternatively, the insulating interlayer 590 may cover the gate electrode 570 in the sub-pixel region 20, and may be formed as a substantially uniform thickness along a profile of the gate electrode 570. The insulating interlayer 590 may be formed using a silicon compound, a metal oxide, etc.

A source electrode 610 and a drain electrode 630 may be formed in the sub-pixel region 20 on the insulating interlayer 590. The source electrode 610 may be in contact with the source region of the active layer 530 via a contact hole formed by removing a portion of the gate insulation layer 550 and the insulating interlayer 590 each. The drain electrode 630 may be in contact with a drain region of the active layer 530 via a contact hole formed by removing a portion of the gate insulation layer 550 and the insulating interlayer 590 each. Each of the source electrode 610 and the drain electrode 630 may be formed using a metal, an alloy, metal nitride, conductive metal oxide, transparent conductive materials, etc. These may be used alone or in a suitable combination thereof. Alternatively, each of the source electrode 610 and the drain electrode 630 may have a multilayer structure. Accordingly, a semiconductor element 650 including the active layer 530, the gate insulation layer 550, the gate electrode 570, the insulating interlayer 590, the source electrode 610, and the drain electrode 630 may be formed.

Figure 8:
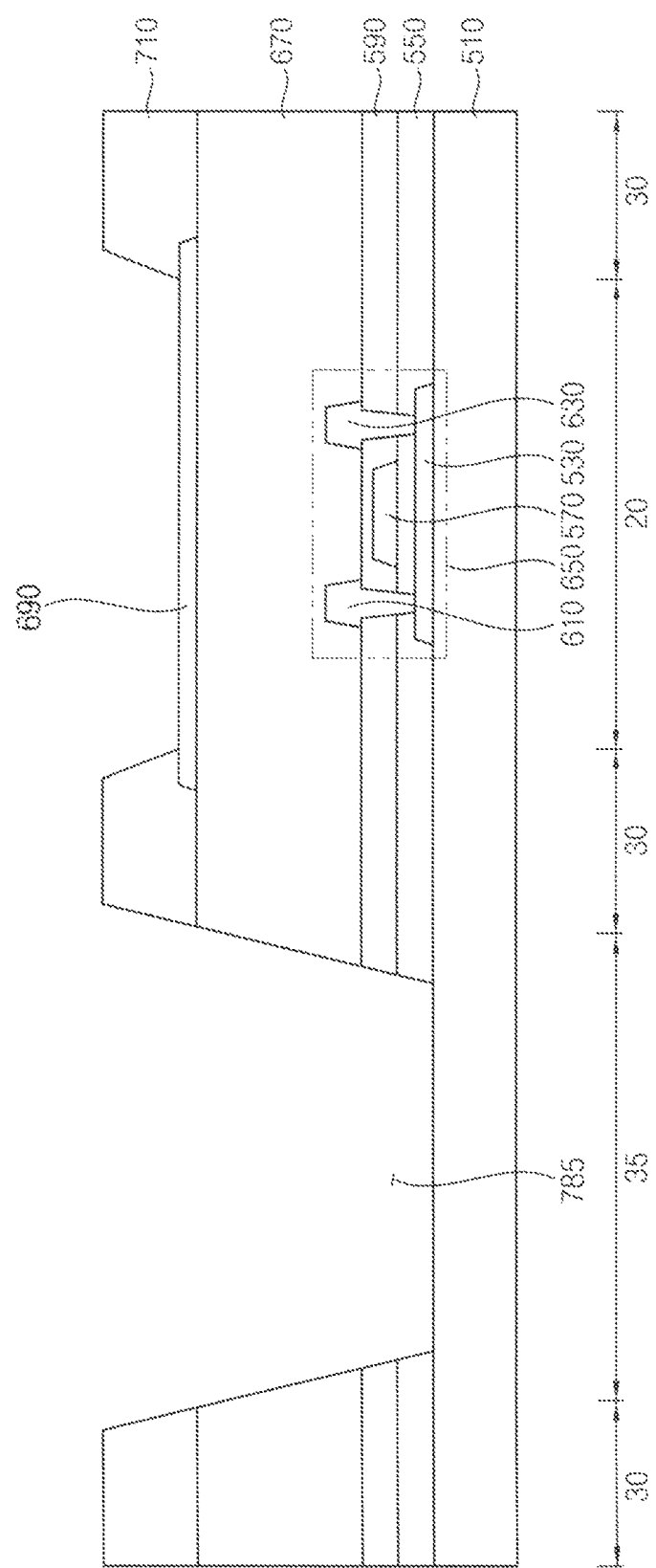

Referring to FIG. 8, a planarization layer 670 may be formed on the source electrode 610 and the drain electrode 630. The planarization layer 670 may cover the source electrode 610 and the drain electrode 630 in the sub-pixel region 20 on the insulating interlayer 590, and may be formed on the entire insulating interlayer 590. In example embodiments, the planarization layer 670 may be formed as a relatively high thickness to sufficiently cover the source electrode 610 and the drain electrode 630 in the sub-pixel region 20. In this case, the planarization layer 670 may have a substantially even upper surface, and a planarization process may be further performed on the planarization layer 670 to implement the even upper surface of the planarization layer 670. Alternatively, the planarization layer 670 may cover the source electrode 610 and the drain electrode 630 in the sub-pixel region 20, and may be formed as a substantially uniform thickness along a profile of the source electrode 610 and the drain electrode 630. The planarization layer 670 may include organic materials or inorganic materials. For example, the planarization layer 670 may be formed using inorganic materials such as SiOx, SiNx, SiOxNy, SiOxCy, SiCxNy, etc. Alternatively, the planarization layer 670 may be formed using organic materials such as a photoresist, a polyacryl-based resin, a polyimide-based resin, a polyamide-based resin, a siloxane-based resin, an acryl-based resin, an epoxy-based resin, etc.

A lower electrode 690 may be formed in the sub-pixel region 20 on the planarization layer 670. The lower electrode 690 may be in contact with the drain electrode 630 via a contact hole formed by removing a portion of the planarization layer 670. In addition, the lower electrode 690 may be electrically connected to the semiconductor element 650. The lower electrode 690 may be formed using a metal, a metal alloy, metal nitride, conductive metal oxide, transparent conductive materials, etc. These may be used alone or in a suitable combination thereof. Alternatively, the lower electrode 690 may have a multi-layered structure.

A pixel defining layer 710 may be formed in the reflection region 30 on the planarization layer 670, and may expose a portion of the lower electrode 690. In addition, the pixel defining layer 710 may be formed on the entire planarization layer 670. After the pixel defining layer 710 is formed, a transparent window 785 may be formed in the transparent region 35. The first substrate 510 may be exposed in the transparent region 35 by removing a portion of the gate insulation layer 550, the insulating interlayer 590, the planarization layer 670, and the pixel defining layer 710 each. A portion where the first substrate 510 is exposed in the transparent region 35 may be defined as the transparent window 785. The pixel defining layer 710 may be formed using organic materials or inorganic materials.

Figure 9:
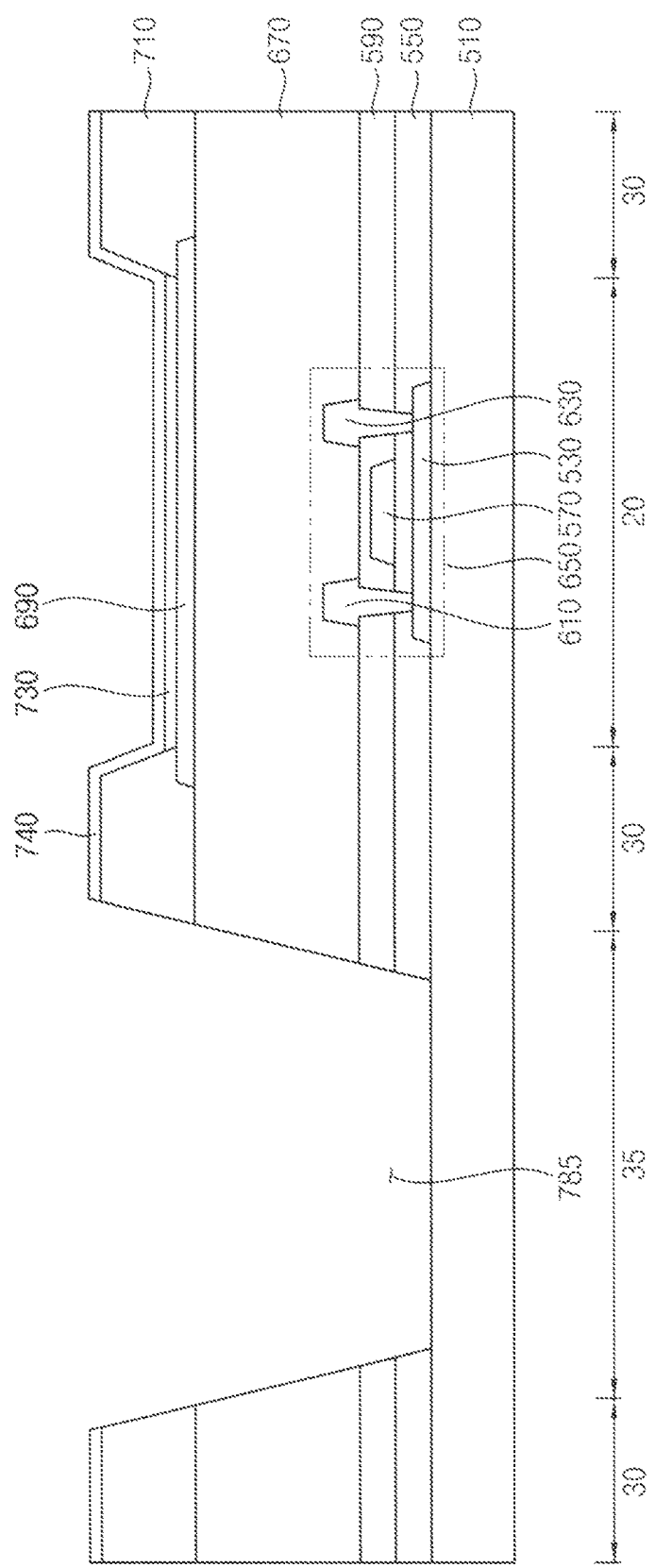

Referring to FIG. 9, a light emitting layer 730 may be formed on a portion of the lower electrode 690 that is exposed by the pixel defining layer 710. The light emitting layer 730 may have a multi-layered structure including an EL, an HIL, an HTL, an ETL, an EIL, etc. The HIL, the HTL, the EL, the ETL, and the EIL may be sequentially formed on the lower electrode 690. The EL of the light emitting layer 730 may be formed using at least one of light emitting materials capable of generating different colors of light (e.g., a red color of light, a blue color of light, and a green color of light, etc). In some example embodiments, the HIL, the HTL, the ETL, the EIL, etc except the EL may be formed in the transparent region 35.

Alternatively, the EL of the light emitting layer 330 may generally generate white light by stacking a plurality of light emitting materials capable of generating different colors of light such as a red color of light, a green color of light, a blue color of light, etc. In this case, a color filter may be disposed on the light emitting layer 730 (e.g., the color filter overlaps the light emitting layer 730). The color filter may include at least one selected from a red color filter, a green color filter, and a blue color filter. Alternatively, the color filter may include a yellow color filter, a cyan color filter, and a magenta color filter. The color filter may include a photo-sensitive resin (or color photoresist), etc.

An upper electrode 740 may be formed on the pixel defining layer 710 and the light emitting layer 730 but not in the transparent region 35.

In example embodiments, after the transparent window 785 is formed, an organic layer may be formed in the inside of the transparent window 785. When the organic layer is formed in the transparent window 725, the upper electrode 740 may not be formed in a region where the organic layer is formed in a process that the upper electrode 740 is formed. That is, a region where the upper electrode 740 is formed may be controlled by using the organic layer. The upper electrode 740 may cover the pixel defining layer 710 and the light emitting layer 730 except the transparent region 35, and may be formed on the entire first substrate 510. As the upper electrode 740 is not formed in the transparent region 35, a transmissivity of the display device may be increased. The upper electrode 740 may be formed using a metal, a metal alloy, metal nitride, conductive metal oxide, transparent conductive materials, etc. These may be used alone or in a suitable combination thereof. In addition, the organic layer may include lithium quinoline (LiQ). The LiQ may have a low adhesive strength to a metal, and may be transparent.

Figure 10:
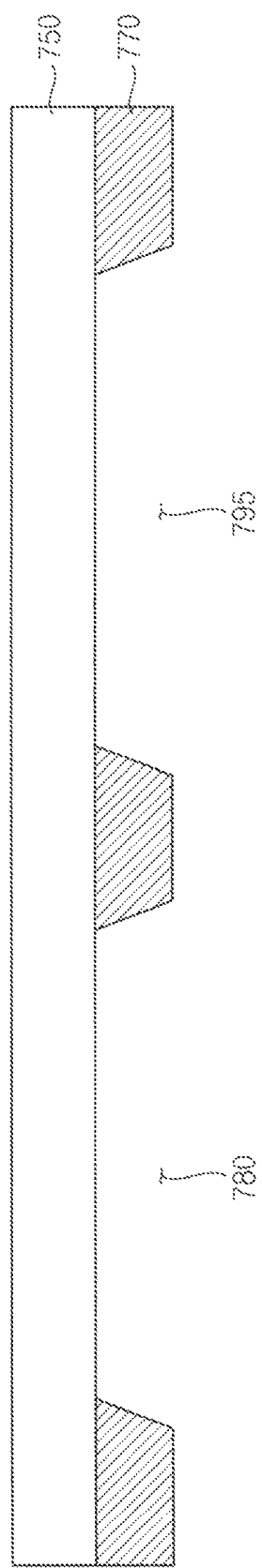

Referring to FIG. 10, a second substrate 750 may be provided. The second substrate 750 and the first substrate 510 may include substantially the same materials. In some example embodiments, the second substrate 750 may include a transparent inorganic material or flexible plastic. For example, the second substrate 750 may include a flexible transparent resin substrate. In this case, to increase flexibility of the display device, the second substrate 750 may include a stacked structure where at least one organic layer and at least one inorganic layer are alternately stacked.

A reflection pattern 770 may be formed on a lower surface of the second substrate 750. The reflection pattern 770 may include a first surface and a second surface that is opposite to the first surface. The first surface of the reflection pattern 770 may be in contact with the second substrate 350, and the second surface of the reflection pattern 770 may be in contact with the transflective reflection pattern that will be illustrated below. A light incident through the second substrate 750 from an outside may be reflected from the first surface of the reflection pattern 370, and a light generated from the light emitting layer 730 of the display device may pass through the opening 795 located in the sub-pixel region 20. Meanwhile, the camera module that will be described below may capture an image of an object that is located above the front of the display device via the openings 780 located in the transparent region 35. The reflection pattern 770 may include a material that has relatively high reflective index. For example, the reflection pattern 770 may be formed using Au, Ag, Al, Pt, Ni, Ti, etc. Alternatively, the reflection pattern 770 may be formed using a metal, a metal alloy, metal nitride, conductive metal oxide, transparent conductive materials, etc. For example, the reflection pattern 770 may be formed of an alloy of aluminum, AlNx, an alloy of silver, WNx, an alloy of copper, CrNx, an alloy of molybdenum, TiNx, Ta, TaNx, SRO, ZnOx, SnOx, InOx, GaOx, ITO, IZO, etc. These may be used alone or in a suitable combination.

Figure 11:
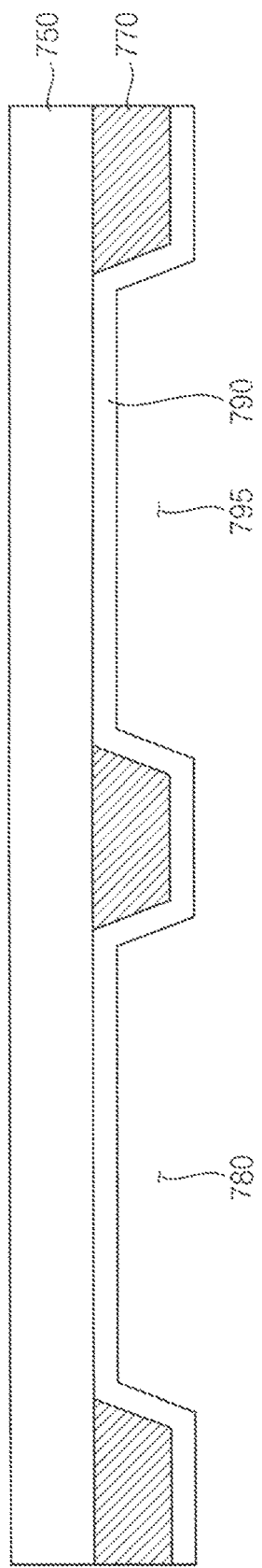

Referring to FIG. 11, a transflective reflection pattern 790 may cover the second substrate 750 and the reflection pattern 770 on the second substrate 750 and the reflection pattern 770, and may be entirely formed on a lower surface of the second substrate 750. The transflective reflection pattern 790 may transmit a portion of light and may reflect a remaining portion of the light. For example, a thickness of the transflective reflection pattern 790 may be less than that of the reflection pattern 770, and a light transmissivity of the transflective reflection pattern 790 may be greater than that of the reflection pattern 770. In addition, the transflective reflection pattern 790 may prevent a diffraction phenomenon of light capable of being generated from the reflection pattern 770 having a plurality of openings 780 and 795. Accordingly, the display device may serve as a mirror display device that visibility of the display device is relatively improved. For example, the transflective reflection pattern 790 may be formed using Au, Ag, Al, Pt, Ni, Ti, etc. Alternatively, the transflective reflection pattern 790 may be formed using a metal, a metal alloy, metal nitride, conductive metal oxide, transparent conductive materials, etc.

Figure 12:
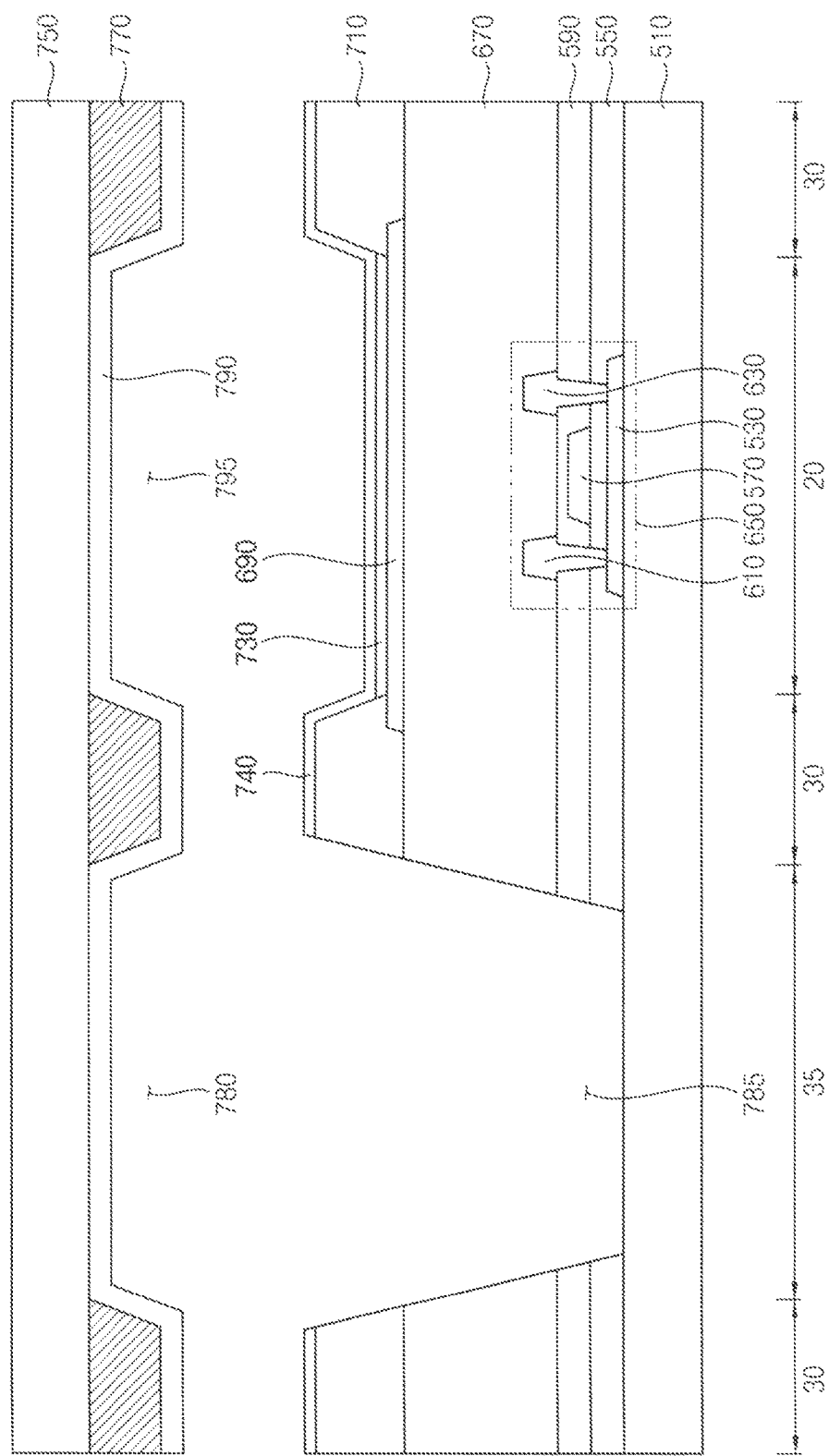

Referring to FIG. 12, the second substrate 750 including the transflective reflection pattern 790 and the reflection pattern 770 may be combined with the first substrate 510. A sealing process may be performed to combine the first substrate 510 with the second substrate 750. In this case, a sealant may be interposed in both lateral portions between the first substrate 510 and the second substrate 750. The sealant may include a frit, etc. The first substrate 510 and the second substrate 750 may be combined to each other through a laser irradiation. Here, the laser may be irradiated into the sealant. In the laser irradiation process, a phase of the sealant may be changed from a solid phase to a liquid phase. Then, the sealant having the liquid phase may be cured so that the sealant may have the solid phase again after a predetermined time. In accordance with the phase change of the sealant, the substrate 510 may be combined with the second substrate 750. The seal combination of the first substrate 510 and the second substrate 750 may protect the display device from permeation of water, moisture, oxygen, etc. The display device may not be deteriorated by the water, the moisture, the oxygen, etc. Accordingly, a display panel 600 may be formed.

Figure 13A:
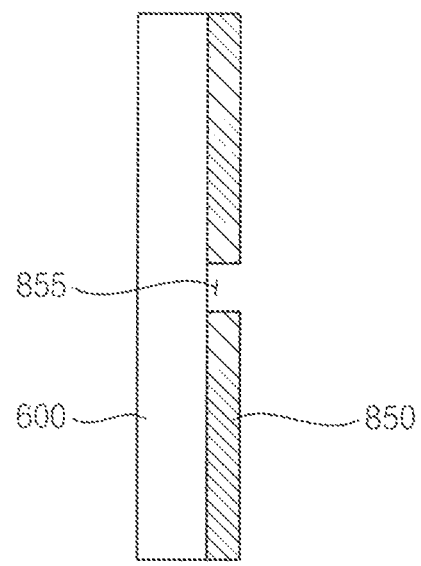

Referring to FIG. 13A, a first surface (e.g., the front of the display device) of the display panel 600 may display an image, and a second surface, which is opposite to the first surface, of the display panel 600 may be in contact with a heat sink plate 850.

The heat sink plate 850 may be formed in the second surface on the display panel 600. For example, the heat sink plate 850 may be formed between the display panel 600 and a camera module that will be described below. As the heat sink plate 850 is formed in the second surface of the display panel 600, a heat generated in the display panel 600 may be cooled. When the heat generated in the display panel 600 is not cooled, a performance of the sub-pixel structure included in the display panel 600 may be reduced and a lifetime of the sub-pixel structure may be decreased. The heat sink plate 850 may have the opening 855. The opening 855 of the heat sink plate 850 may be located in a center region. The heat sink plate 850 may include a material that has relatively high heat conductivity. For example, the heat sink plate 850 may be formed using a metal, a metal alloy, etc. For example, the heat sink plate 850 may include Al, an alloy of aluminum, Ag, an alloy of silver, W, Cu, an alloy of copper, Ni, Cr, Mo, an alloy of molybdenum, Ti, Pt, Ta, Nd, Sc, etc. These may be used alone or in a suitable combination.

Figure 13B:
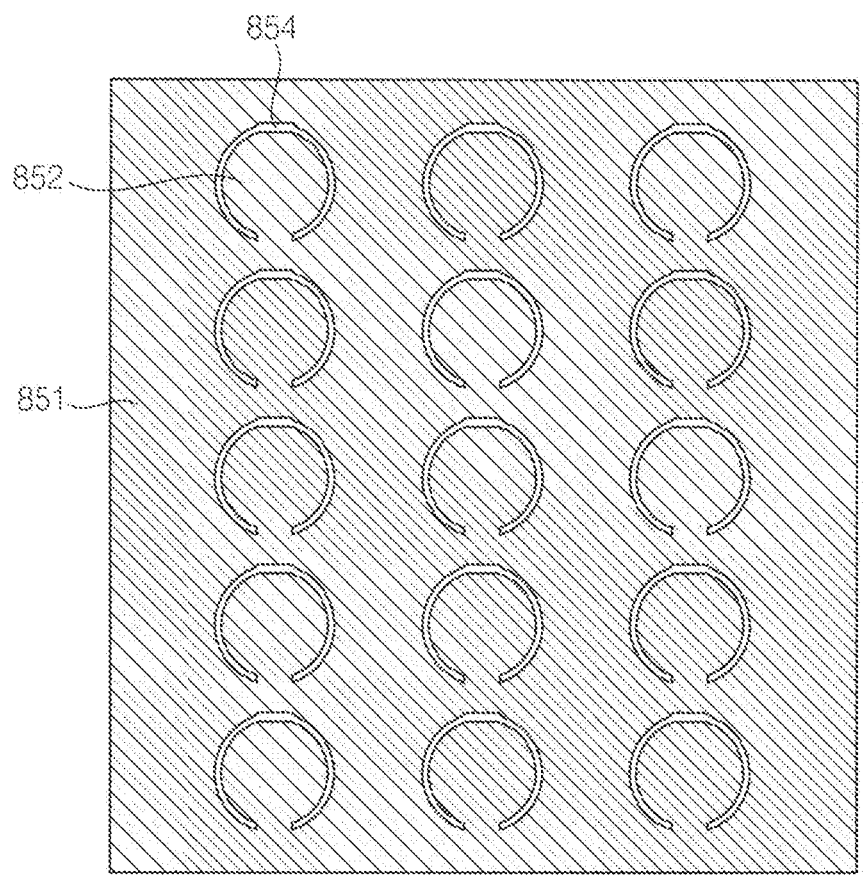
FIG. 13B is a planar view of a heat sink plate with a plurality of tabs.
Figure 13C:
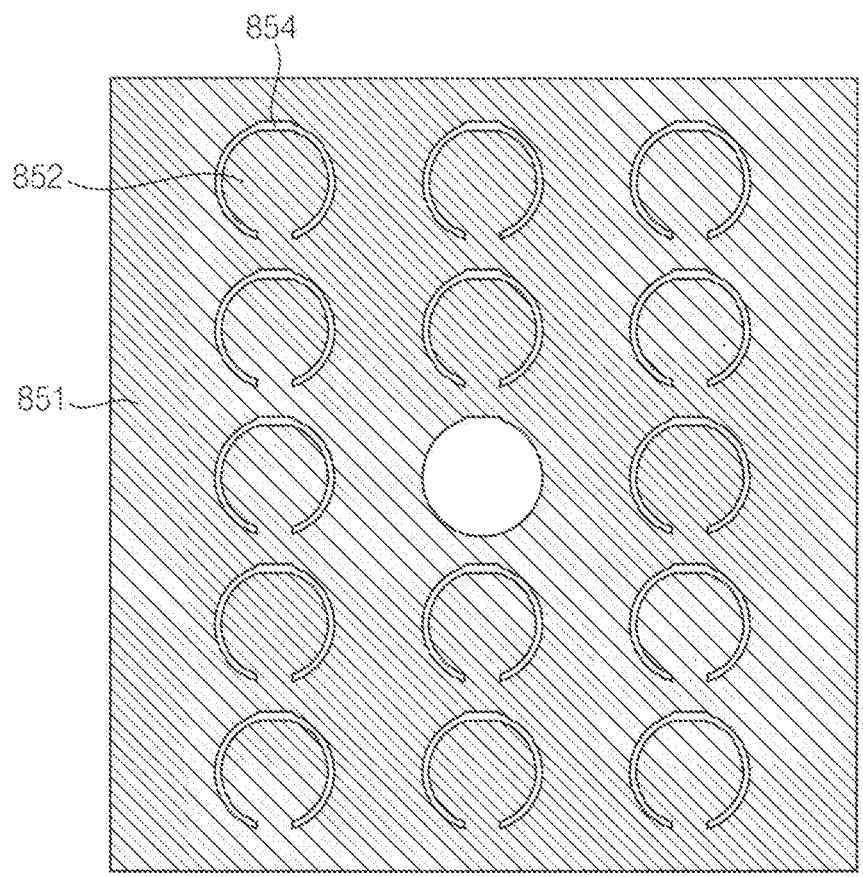
FIG. 13C is a planar view of a heat sink plate with tabs and an opening.
Figure 14:
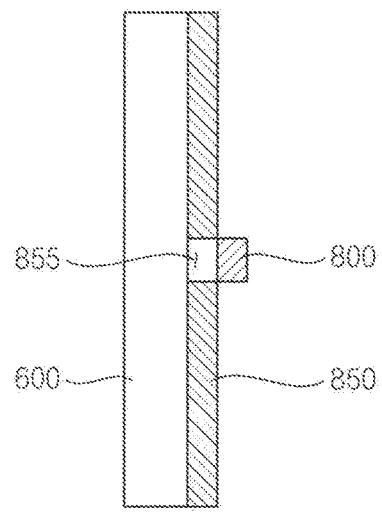

In example embodiments, as illustrated in FIG. 13B, a preliminary heat sink plate 851 may be provided. The preliminary heat sink plate 851 may have a tab 852 and an opening portion 854. The tab 852 may be located in a portion where an opening 855 of the heat sink plate 850 may be formed, and the opening portion 854 may be formed by removing the tab 852. A first portion of the tab 852 may be coupled to the preliminary heat sink plate 851, and a second portion of the tab 852 may be spaced apart from the preliminary heat sink plate 851. The tab 852 may have a substantially circular shape of a circle. The first portion of the tab 852 may face the opening portion 854, and the second portion of the tab 852 may substantially surround the tab 852 except the first portion of the tab 852. In addition, the opening portion 854 may be formed in a portion of the second portion of the tab 852, and a width of the opening portion 854 may be greater than that of the second portion of the tab 852. Here, the width may be a distance from the outermost of the tab 852 to the preliminary heat sink plate 851. After the preliminary heat sink plate 851 is formed in the second surface of the display panel 600, the tab 852 may be readily removed using the opening portion 854. In other words, the tab 852 may be separated from the preliminary heat sink plate 851. For example, the tab 852 corresponding to a position of the camera module that will be formed later may be removed. That is, when the camera module is positioned in the center region of the display panel 600, the tab 852 that is located in the center region of the preliminary heat sink plate 851 may be removed. FIG. 13C shows a heat sink plate 850 with a plurality of tabs 852 wherein one of them in the desired position is removed to form the opening 855.

The display device may further include an adhesive member between the display panel 600 and the heat sink plate 850. The adhesive member may be substantially transparent. The adhesive member may be entirely formed between the display panel 600 and the heat sink plate 850. On the other hand, the adhesive member may be formed between the display panel 600 and the heat sink plate 850 except a portion that corresponds to the opening 855 of the heat sink plate 850. That is, the adhesive member may include an opening that overlaps the opening 855 of the heat sink plate 850.

In some example embodiments, at least two of the tabs 852 may be removed according to the number of the camera module. In some example embodiments, when the camera module is moved on the heat sink plate 850 by using the moving member, all of the tab 852 may be removed.

A camera module 800 may be positioned on the second surface of the display panel 600. For example, the camera module 800 may be positioned in the center region of the second surface of the display panel 600, and the opening 855 may overlap the camera module 400. The camera module 800 obtain an image of an object that is located above the first surface of the display panel 600 via the opening 855 of the heat sink plate 850, the transparent region 35 of the display panel 600. That is, the camera module 800 may squarely obtain the image of the object.

Referring to FIG. 15A, the body 700 may surround the display panel 600, the heat sink plate 850, and the camera module 800. The body 700 may include an upper frame 700*a* and a lower frame 700*b*. As the upper frame 700*a* and the lower frame 700*b* are combined, the display device including the display panel 600, the heat sink plate 850, and the camera module 800 may be provided. In example embodiments, the body 700 may fix the camera module 400 that is positioned in the second surface on the display panel 600. For example, the body 700 may have a protrusion portion in a portion (e.g., in the lower frame 700*b*) where the camera module 800 is surrounded. As described above, in some example embodiments, when at least two of the tabs 852 are removed according to the number of the camera module 400, as illustrate in FIG. 15B, the body 700 may have a plurality of protrusion portions 705. The front and back frames 700*a* and 700*b* of the body 700 may protect the display panel 600, the camera module 800, the heat sink plate 850, etc. The body 700 may be formed using synthetic resin or metal (e.g., stainless steel, titanium, etc). Accordingly, the display device 100 illustrated in FIG. 3A may be provided.

Figure 16:
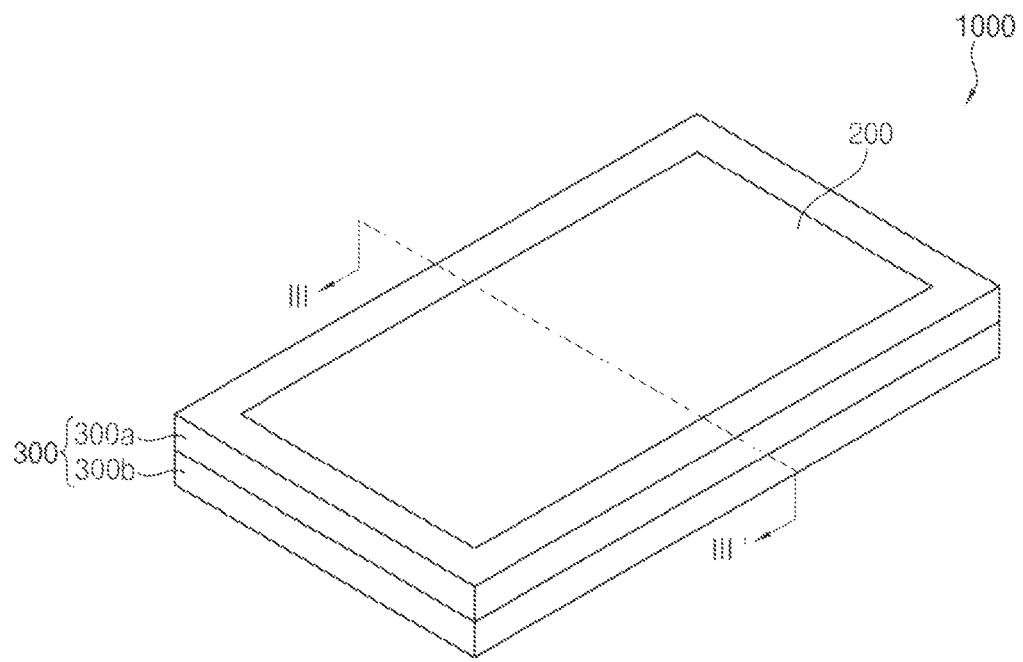
FIG. 16 is a perspective view illustrating a display device in accordance with example embodiments.
Figure 17:
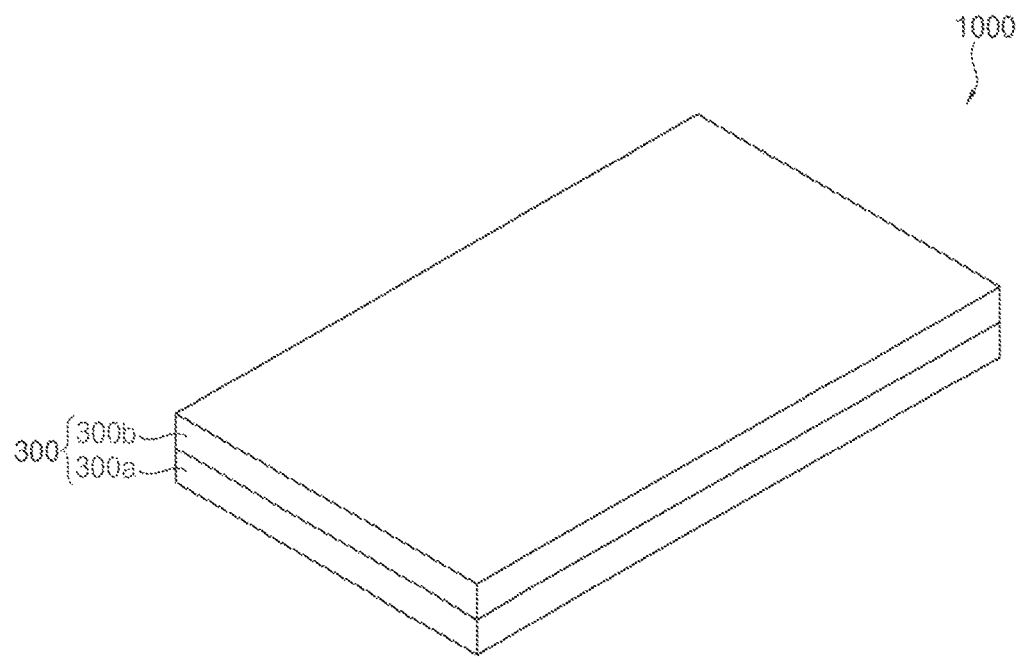
FIG. 17 is a perspective view illustrating a lower surface of the display device of FIG. 16.
Figure 18:
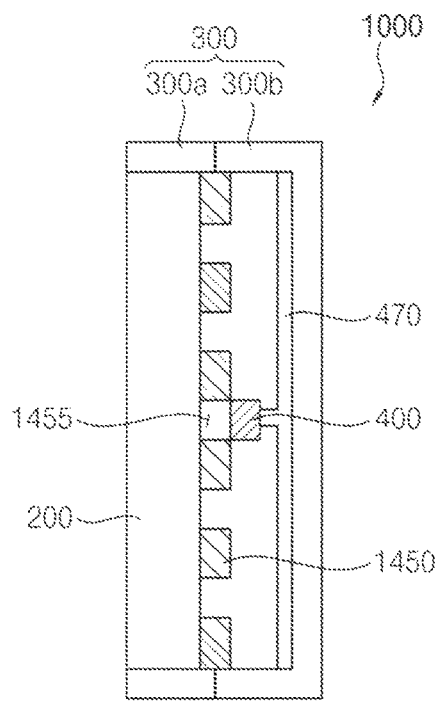
FIG. 18 is a cross-sectional view taken along a line of FIG. 16.
Figure 19:
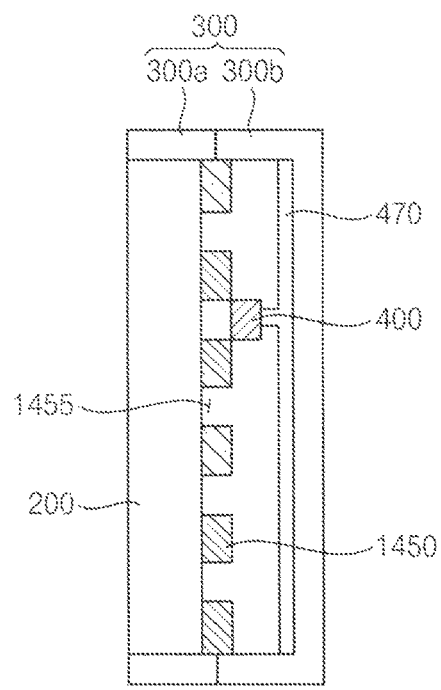
FIG. 19 is a cross-sectional view for describing a moving member included in the display device of FIG. 18.
Figure 20:
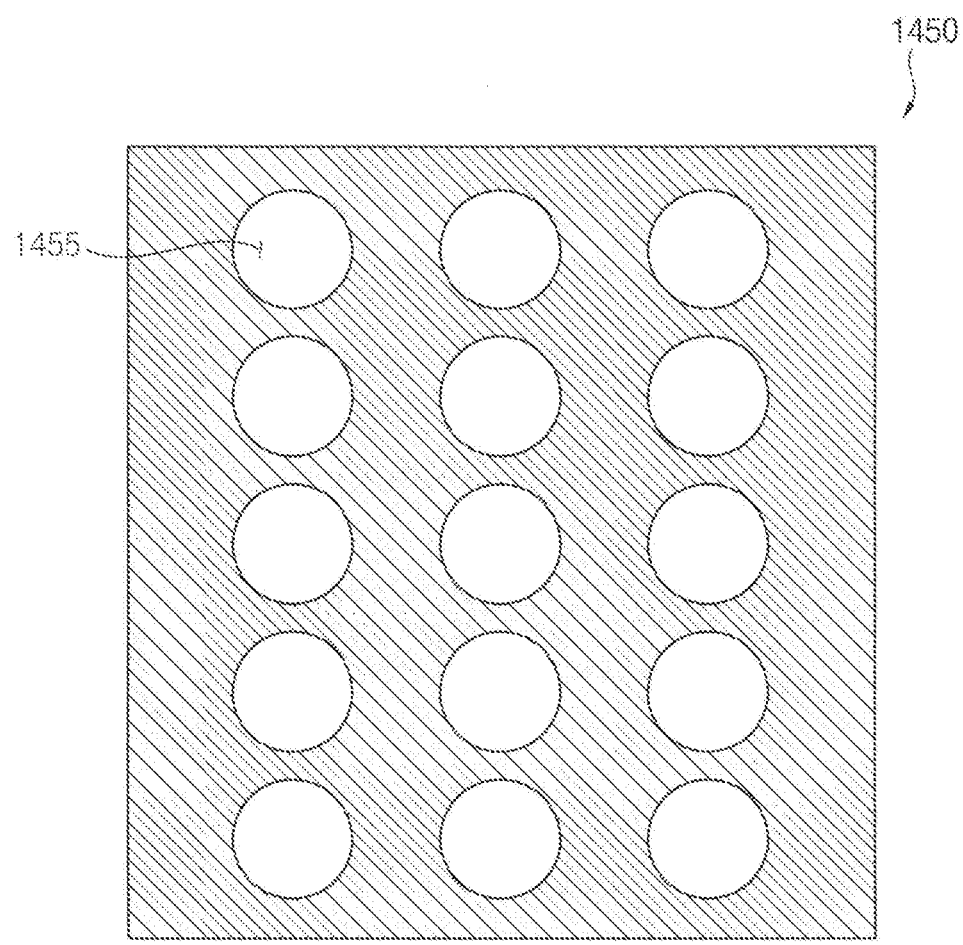
FIG. 20 is a planar view for describing a heat sink plate included in the display device of FIG. 18.

FIG. 16 is a perspective view illustrating a display device in accordance with example embodiments, and FIG. 17 is a perspective view illustrating a lower surface of the display device of FIG. 16. FIG. 18 is a cross-sectional view take along a line of FIG. 16, and FIG. 19 is a cross-sectional view for describing a moving member included in the display device of FIG. 18. FIG. 20 is a planar view for describing a heat sink plate included in the display device of FIG. 18. A display device 1000 illustrated in FIGS. 16, 17, 18, 19, and 20 may have a configuration substantially the same as or similar to that of a display device 100 described with reference to FIGS. 1, 2, 3, 4, 5, and 6 except a moving member 470 and a heat sink plate 1450. In FIGS. 16, 17, 18, 19, and 20, detailed descriptions for elements that are substantially the same as or similar to elements described with reference to FIGS. 1, 2, 3, 4, 5, and 6 may not be repeated.

Referring to FIGS. 16, 17, 18, 19, and 20, a display device 1000 may include a display panel 200, a camera module 400, a heat sink plate 1450, a body 300, a moving member 470, etc. Here, the heat sink plate 1450 may have a plurality of openings 1455, and the display panel 200 may include a first substrate 110, a sub-pixel structure, a second substrate 350, a reflection pattern 370, a transflective reflection pattern 390, etc. In example embodiments, the display panel 200 may include a plurality of pixel regions 10. One pixel region 10 among a plurality of the pixel regions 10 may include first, second, and third sub-pixel regions 15, 20, and 25, a transparent region 35, and a reflection region 30. As the display device 1000 includes the reflection region 30, the display device 1000 may reflect an image of an object that is located above the front of the display device 1000. In addition, as the display device 1000 includes the transparent region 35 and the opening 1455, the camera module 400 may obtain (or, film) an image of an object that is located above the front of the display device 1000 via the transparent region 35 and the openings 1455. Further, as the display device 1000 includes the moving member 470, the moving member 470 may move the camera module 400 such that the camera module 400 is positioned in one opening 1455 selected from a plurality of the openings 1455.

Referring again to FIG. 18, a first surface (e.g., the front of the display device 1000) of the display panel 200 may display an image, and a second surface of the display panel 200, which is opposite to the first surface, may be in contact with the heat sink plate 1450.

The camera module 400 may be positioned on the second surface of the display panel 200. The camera module 400 captures an image of an object that is in front of the first surface of the display panel 200 via the opening 1455 of the heat sink plate 1450 and the transparent region 35 of the display panel 200. That is, the camera module 400 may squarely capture the image of the object.

The heat sink plate 1450 may be positioned in the second surface on the display panel 200. For example, the heat sink plate 1450 may be disposed between the display panel 200 and the camera module 400. As the heat sink plate 1450 is disposed in the second surface of the display panel 200, a heat generated in the display panel 200 may be cooled. As illustrated in FIG. 20, the heat sink plate 1450 may have a plurality of openings 1455. The openings 1455 of the heat sink plate 1450 may be spaced apart from each other, and may be regularly arranged. Alternatively, the openings 1455 may be irregularly arranged. In example embodiments, the camera module 400 may be aligned with one opening 1455 selected from a plurality of the openings 1455. In some embodiments, the camera module 400 may be aligned with an opening 1455 and the transparent region 35. As used herein, "aligned with" means elements are lined up at least partially. Hence, if the camera module 400 is aligned with an opening 1455 and the transparent region 35, the camera module 400 is able to capture an image of an object that is in front of the display panel 200 through the transparent region 35 and the opening 1455. The heat sink plate 1450 may include a material that has relatively high heat conductivity. For example, the heat sink plate 1450 may include a metal, a metal alloy, etc.

The body 300 may surround the display panel 200, the heat sink plate 1450, the camera module 400, and the moving member 470. The body 300 may include a front frame 300*a* and a back frame 300*b*. As the front frame 300*a* and the back frame 300*b* are combined, the display device 1000 including the display panel 200, the heat sink plate 1450, the camera module 400, and the moving member 470 may be provided. In example embodiments, the back frame 300*b* may fix the moving member 470. The front and back frames 300*a* and 300*b* of the body 300 may protect the display panel 200, the camera module 400, the heat sink plate 450, the moving member 470, etc. The body 300 may include synthetic resin or metal (e.g., stainless steel, titanium, etc).

The moving member 470 may be disposed on the camera module 400 that is positioned on the second surface of the display panel 200. For example, the moving member 470 may include a rail/groove formed in a grid configuration that is parallel to the heat sink plate 1450. The moving member 470 may be coupled to the camera module 400 such that the camera module 400 may be moved between the heat sink plate 1450 and the moving member 470, for example by sliding through the rail/groove. As illustrated in FIG. 18, the camera module 400 may be positioned in the center region of the display panel 200, or as illustrated in FIG. 19, the camera module 400 may be positioned in the peripheral region. That is, the display device 1000 may move the camera module 400 using the moving member 470 such that the position of the object corresponds to a position of the camera module 400 according to a position of an object that is located above the first surface of the display panel 200. Accordingly, although the position of the object that is located above the first surface of the display panel 200 is changed, the camera module 400 may squarely capture an image of the object after the camera module 400 is moved using the moving member 470 such that the camera module 400 corresponds to the position of the object. In some embodiments, there may be a plurality of camera modules 400.

Figure 21:
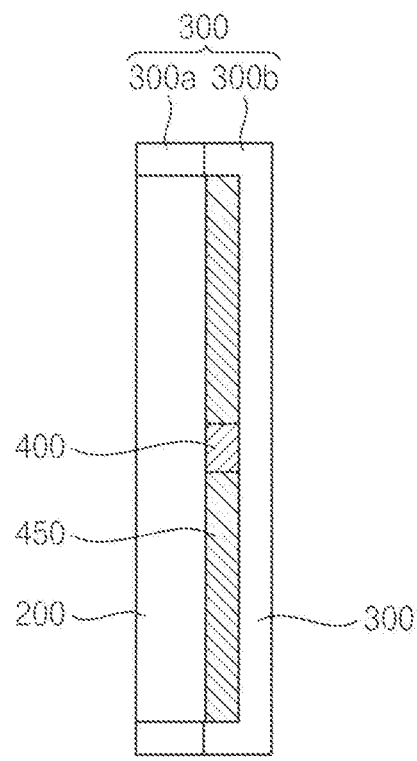
FIG. 21 is a cross-sectional view illustrating a display device in accordance with example embodiments.

FIG. 21 is a cross-sectional view illustrating a display device in accordance with example embodiments. A display device illustrated in FIG. 21 may have a configuration substantially the same as or similar to that of a display device 100 described with reference to FIGS. 1, 2, 3, 4, 5, and 6 except a position of the camera module 400. In FIG. 21, detailed descriptions for elements that are substantially the same as or similar to elements described with reference to FIGS. 1, 2, 3, 4, 5, and 6 may not be repeated.

Referring to FIG. 21, a display device may include a display panel 200, a camera module 400, a heat sink plate 450, a body 300, etc. Here, the heat sink plate 450 may have an opening, and the display panel 200 may include a first substrate 110, a sub-pixel structure, a second substrate 350, a reflection pattern 370, a transflective reflection pattern 390, etc. In example embodiments, the display panel 200 may include a plurality of pixel regions 10. One pixel region 10 among a plurality of the pixel regions 10 may include first, second, and third sub-pixel regions 15, 20, and 25, a transparent region 35, and a reflection region 30.

A first surface of the display panel 200 may display an image, and a second surface, which is opposite to the first surface, of the display panel 200 may be in contact with the heat sink plate 450.

The heat sink plate 450 may be positioned on the second surface on the display panel 200. For example, the heat sink plate 450 may be disposed between the display panel 200 and the body 300. The heat sink plate 450 may have an opening located in the center region.

The camera module 400 may be disposed in the opening of the heat sink plate 450. For example, the camera module 400 may be fixed by the heat sink plate 450. The camera module 400 obtains an image of an object that is located above the first surface of the display panel 200 via the opening of the heat sink plate 450 and the transparent region 35 of the display panel 200. That is, the camera module 400 may squarely capture the image of the object.

The body 300 may surround the display panel 200, the heat sink plate 450, and the camera module 400. The body 300 may include a front frame 300*a* and a back frame 300*b*. As the front frame 300*a* and the back frame 300*b* are combined, the display device including the display panel 200, the heat sink plate 450, and the camera module 400 may be provided. In example embodiments, the back frame 300*b* may fix the heat sink plate 450 and the camera module 400.

Figure 22:
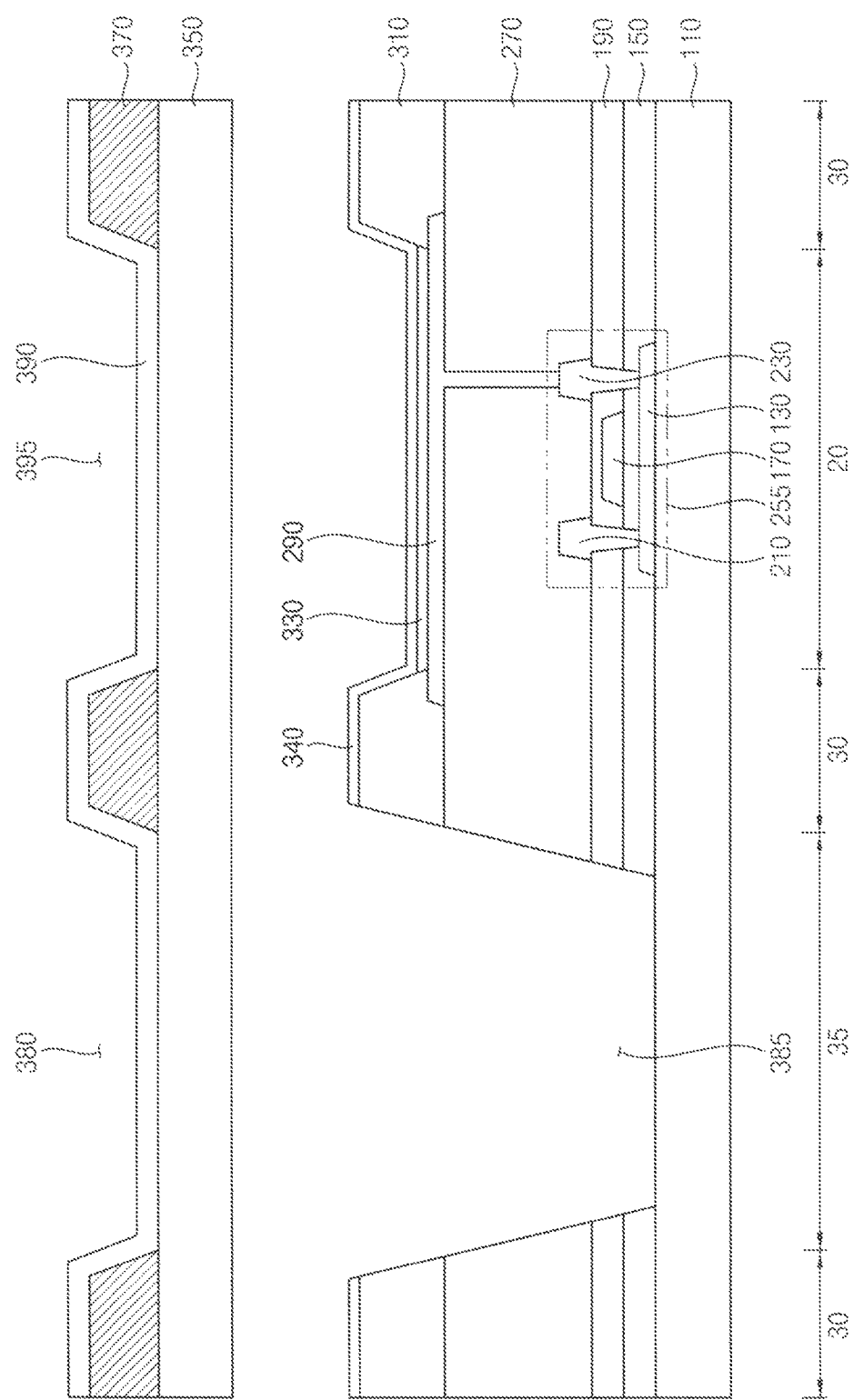
FIG. 22 is a cross-sectional view illustrating an example of a display panel included in the display device of FIG. 1.
Figure 23:
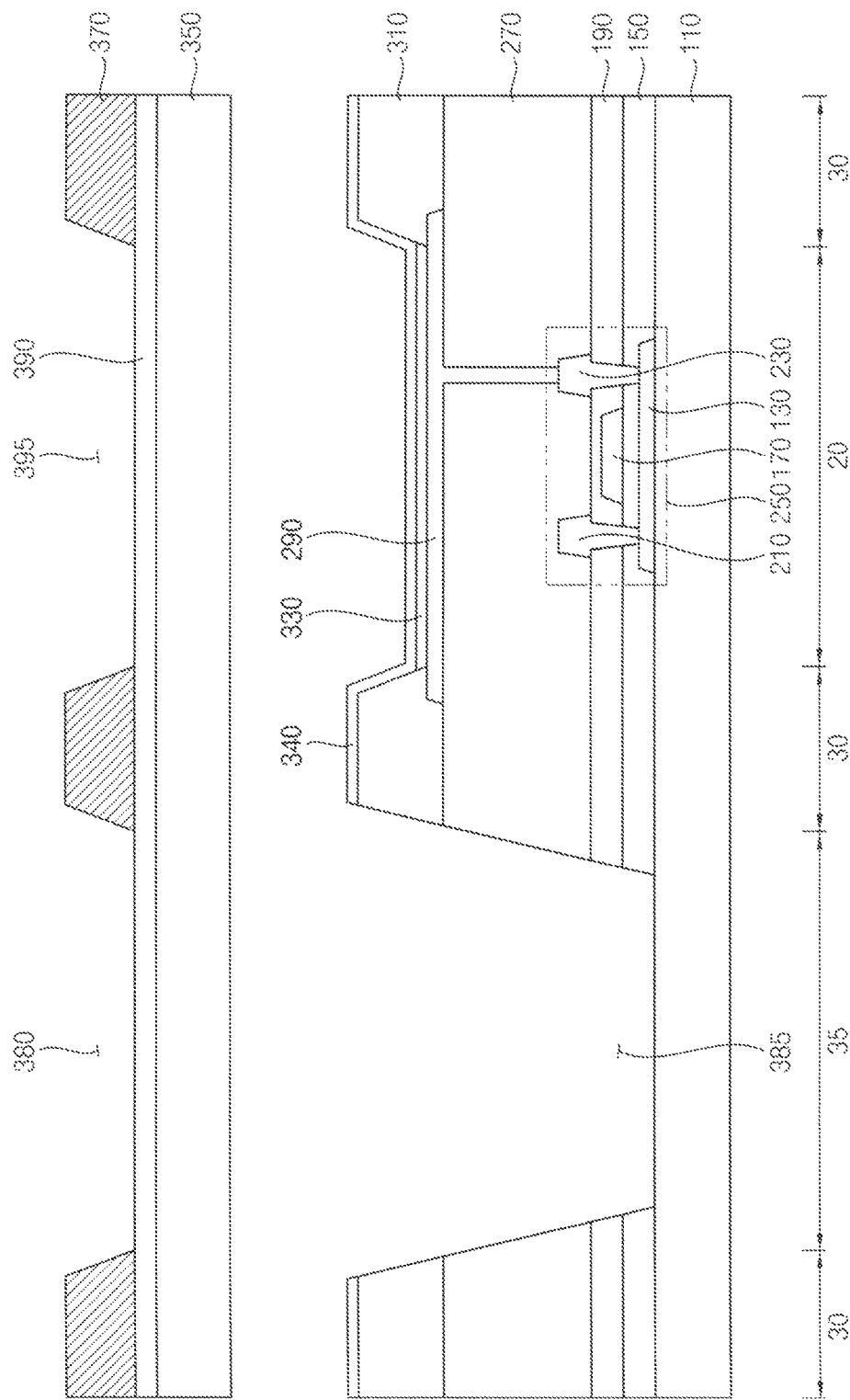
FIG. 23 is a cross-sectional view illustrating an example of a display panel included in the display device of FIG. 1.
Figure 24:
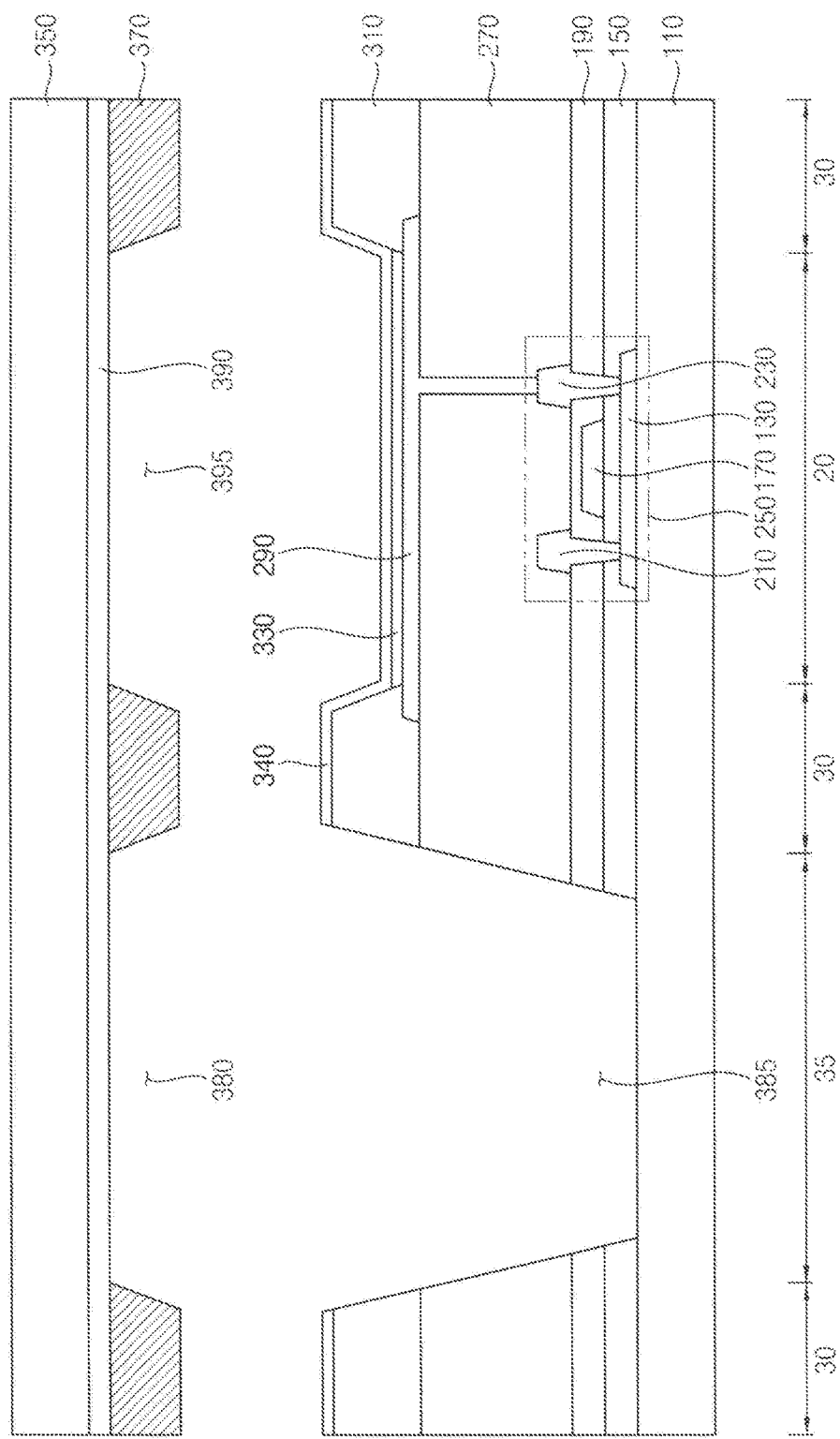
FIG. 24 is a cross-sectional view illustrating an example of a display panel included in the display device of FIG. 1.

FIG. 22 is a cross-sectional view illustrating an example of a display panel included in the display device of FIG. 1, and FIG. 23 is a cross-sectional view illustrating an example of a display panel included in the display device of FIG. 1. FIG. 24 is a cross-sectional view illustrating an example of a display panel included in the display device of FIG. 1. Display panels included in a display device illustrated in FIGS. 22, 23, and 24 may have a configuration substantially the same as or similar to that of a display panel 200 included in a display device 100 described with reference to FIGS. 1, 2, 3, 4, 5, and 6 except a reflection pattern 370 and a transflective reflection pattern 390. In FIGS. 22, 23, and 24, detailed descriptions for elements that are substantially the same as or similar to elements described with reference to FIGS. 1, 2, 3, 4, 5, and 6 may not be repeated.

Referring to FIG. 22, the reflection pattern 370 may be disposed in the reflection region 30 on the second substrate 350. That is, the reflection pattern 370 may be disposed on the front surface of the second substrate 350.

The transflective reflection pattern 390 may cover the second substrate 350 and the reflection pattern 370 on the second substrate 350 and the reflection pattern 370, and may be entirely disposed on the front surface of the second substrate 350. That is, the reflection pattern 370 may be disposed between the second substrate 350 and the transflective reflection pattern 390.

Referring to FIG. 23, the transflective reflection pattern 390 may be disposed on the entire second substrate 350.

The reflection pattern 370 may be disposed in the reflection region 30 on the transflective reflection pattern 390. In this particular embodiment, the reflection pattern 370 is disposed between the second substrate 350 and the transflective reflection pattern 390.

Referring to FIG. 24, the reflection pattern 370 and the transflective reflection pattern 390 may be located between the second substrate 350 and the sub-pixel structure. The transflective reflection pattern 390 may be disposed on the back surface of the second substrate 350, and may be disposed to cover the entire back surface of the second substrate 350.

The reflection pattern 370 may be disposed on a lower surface of the transflective reflection pattern 390. That is, the transflective reflection pattern 390 may be disposed between the reflection pattern 370 and the second substrate 350.

Figure 25:
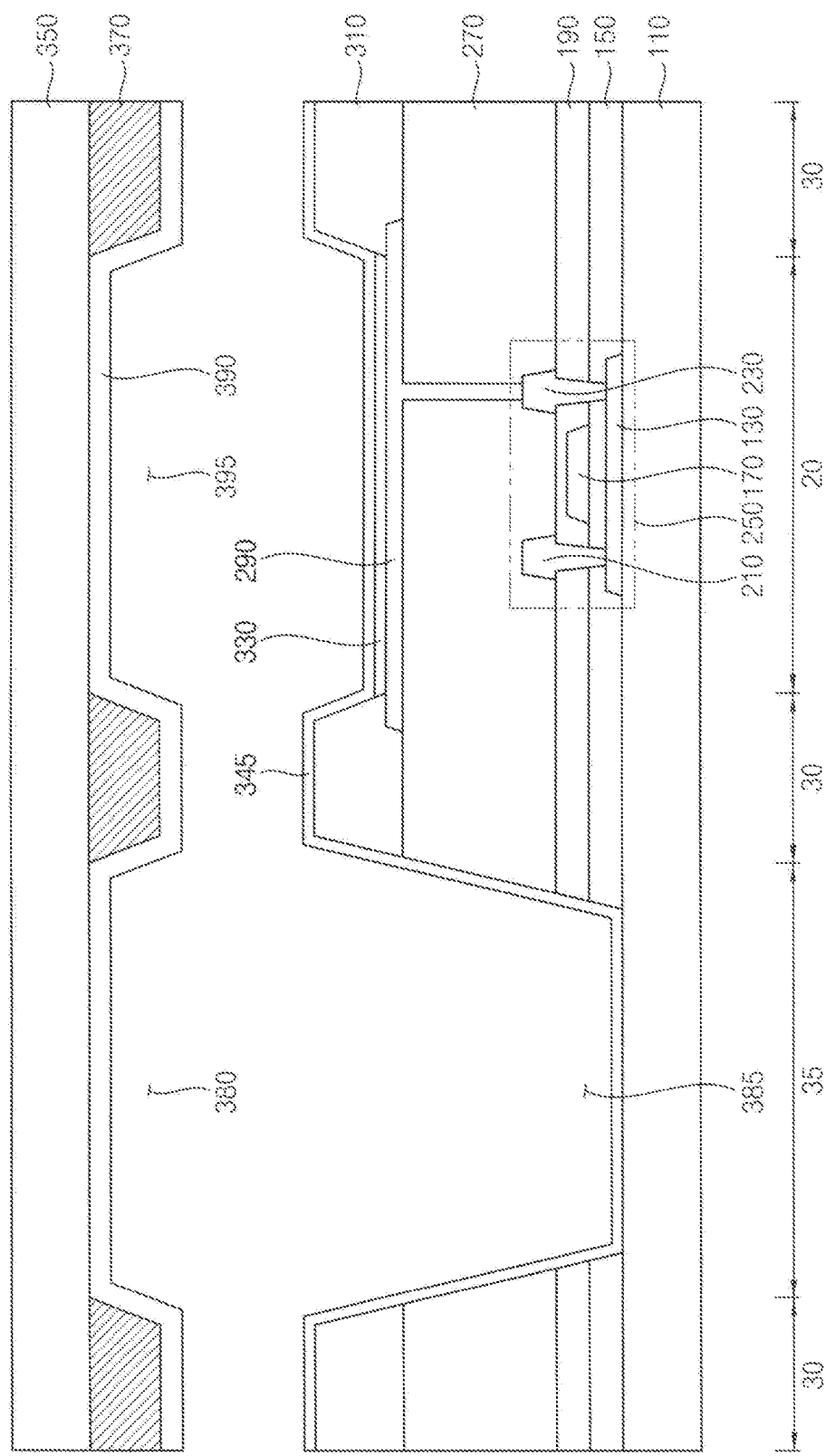
FIG. 25 is a cross-sectional view illustrating an example of a display panel included in the display device of FIG. 1.
Figure 26:
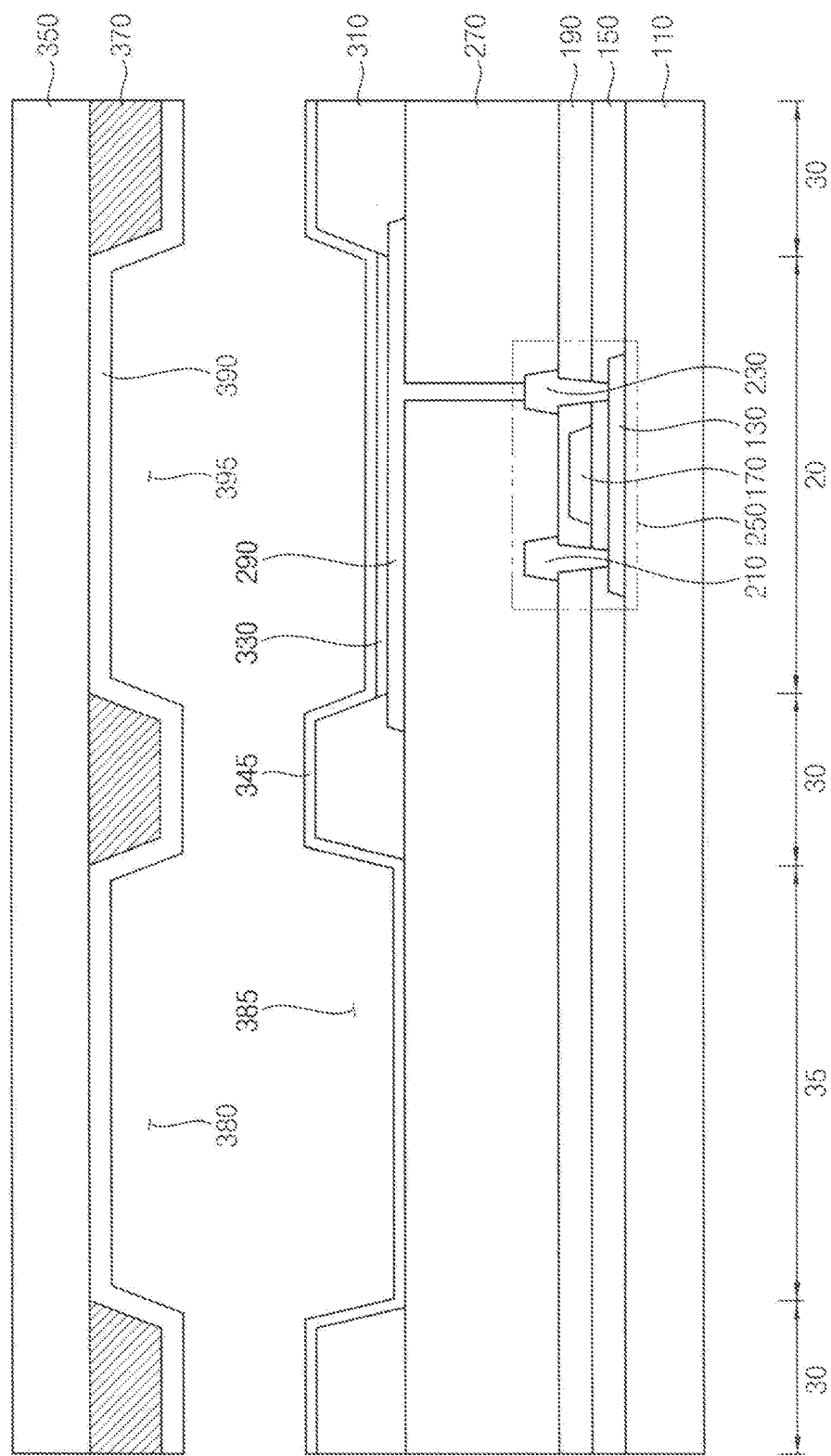
FIG. 26 is a cross-sectional view illustrating an example of a display panel included in the display device of FIG. 1.

FIG. 25 is a cross-sectional view illustrating an example of a display panel included in the display device of FIG. 1, and FIG. 26 is a cross-sectional view illustrating an example of a display panel included in the display device of FIG. 1.

Display panels included in a display device illustrated in FIGS. 25 and 26 may have a configuration substantially the same as or similar to that of a display panel 200 included in a display device 100 described with reference to FIGS. 1, 2, 3, 4, 5, and 6 except for the shape of an upper electrode 345 or a shape of insulation layers. In FIGS. 25 and 26, detailed descriptions for elements that are substantially the same as or similar to elements described with reference to FIGS. 1, 2, 3, 4, 5, and 6 may not be repeated.

Referring to FIG. 25, the upper electrode 345 may be disposed on the pixel defining layer 310 and the light emitting layer 330, and may be disposed in the transparent region 35. That is, the upper electrode 345 may be disposed on the entire first substrate 110.

In some example embodiments, the pixel defining layer 310 and the planarization layer 270 may be removed in the transparent region 35 of the display device, and the insulating interlayer 190 and the gate insulation layer 150 may not be removed in the transparent region 35. For example, the gate insulation layer 150 and the insulating interlayer 190 may be disposed on the entire first substrate 110, and the planarization layer 270 and the pixel defining layer 310 may expose the insulating interlayer 190 in the transparent region 35. Referring to FIG. 26, the gate insulation layer 150 may be disposed on the active layer 130. The gate insulation layer 150 may cover the active layer 130 in the sub-pixel region 20 on the first substrate 110, and may be disposed in the transparent region 35. That is, the gate insulation layer 150 may be disposed on the entire first substrate 110.

The insulating interlayer 190 may be disposed on the gate electrode 170. The insulating interlayer 190 may cover the gate electrode 170 in the sub-pixel region 20 on the gate insulation layer 150, and may be disposed in the transparent region 35. That is, the insulating interlayer 190 may be disposed on the entire first substrate 110.

The planarization layer 270 may be disposed on the source electrode 210 and the drain electrode 230. The planarization layer 270 may cover the source electrode 210 and the drain electrode 230 in the sub-pixel region 20 on the insulating interlayer 190, and may be disposed in the transparent region 35. That is, the planarization layer 270 may be disposed on the entire insulating interlayer 190.

In some example embodiments, a transparent window 385 may not be formed in the transparent region 35 of the display device. For example, the pixel defining layer 310 may not expose the planarization layer 270 in the transparent region 35. That is, the pixel defining layer 310 may have a substantially even front surface in the transparent region 35, and the upper electrode 345 may be disposed in the transparent region 35 on the pixel defining layer 310 (or, the upper electrode 345 may expose the transparent region 35). In this case, the gate insulation layer 150, the insulating interlayer 190, the planarization layer 270, the pixel defining layer 310, and the upper electrode 345 may be disposed in the transparent region 35. The "transparent region" 35 refers to a region where metal wirings (e.g., scan signal wirings, data signal wirings, initial signal wirings, emission signal wiring, power supply voltage wirings, etc) and the semiconductor element 250 are absent.

The present inventive concept may be applied to various display devices including a display device. For example, the present inventive concept may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
    a display panel displaying an image on a first surface, the display panel including a plurality of pixel regions each having a sub-pixel region, a transparent region, and a reflection region surrounding the sub-pixel regions and the transparent region and having:
    a first substrate;
        a sub-pixel structure in the sub-pixel region on the first substrate;
        a second substrate on the sub-pixel structure; and
        a reflection pattern on the second substrate, the reflection pattern including openings in the sub-pixel region and the transparent region;
    a camera module on a second surface of the display panel, the second surface being opposite to the first surface; and
    a heat sink plate between the display panel and the camera module, the heat sink plate having an opening that is aligned with the camera module.

2. The display device of claim 1, wherein the display panel further includes:
    a transflective reflection pattern on the second substrate.

3. The display device of claim 2, wherein a thickness of the transflective reflection pattern is less than a thickness of the reflection pattern, and a light transmissivity of the transflective reflection pattern is greater than a light transmissivity of the reflection pattern.

4. The display device of claim 2, wherein the reflection pattern and the transflective reflection pattern are disposed between the second substrate and the sub-pixel structure, and the reflection pattern is interposed between the second substrate and the transflective reflection pattern.

5. The display device of claim 2, wherein the reflection pattern and the transflective reflection pattern are disposed between the second substrate and the sub-pixel structure, and the transflective reflection pattern is interposed between the second substrate and the reflection pattern.

6. The display device of claim 2, wherein the reflection pattern and the transflective reflection pattern are disposed on an upper surface of the second substrate, and the reflection pattern is interposed between the second substrate and the transflective reflection pattern.

7. The display device of claim 2, wherein the reflection pattern and the transflective reflection pattern are disposed on an upper surface of the second substrate, and the transflective reflection pattern is interposed between the second substrate and the reflection pattern.

8. The display device of claim 1, wherein the second surface of the display panel includes a center region and a peripheral region surrounding the center region, and wherein the camera module is positioned in the center region or the peripheral region.

9. The display device of claim 8, wherein the camera module is positioned in the center region.

10. The display device of claim 1, wherein the camera module obtains an image of an object that is located in front of the first surface of the display panel via the opening of the heat sink plate and the transparent region of the display panel.

11. The display device of claim 1, wherein the camera module and the opening of the heat sink plate have a circular cross-section.

12. The display device of claim 1, wherein a diameter of the camera module is the same as a diameter of the opening of the heat sink plate.

13. The display device of claim 1, further comprising:
    a body surrounding the display panel, the heat sink plate, and the camera module.

14. The display device of claim 13, wherein the body holds the camera module on the display panel.

15. The display device of claim 14, wherein the body has a protrusion portion in a portion surrounding the camera module.

16. The display device of claim 1, wherein the heat sink plate further includes a plurality of openings.

17. The display device of claim 16, wherein the openings are spaced apart from each other, and are regularly arranged.

18. The display device of claim 16, further comprising:
    a plurality of camera modules positioned in the respective openings.

19. The display device of claim 18, further comprising:
a body surrounding the display panel, the heat sink plate, and the camera modules,
wherein the body fixes the camera modules to the display panel, and has a plurality of protrusion portions in a portion surrounding each of the camera modules.

20. The display device of claim 16, further comprising:
a moving member coupled to the camera module, the moving member being configured to move the camera module on the second surface of the display panel.

21. The display device of claim 20, wherein the moving member moves the camera module such that the camera module is positioned in one of the openings in the heat sink plate.

22. The display device of claim 20, further comprising:
a body surrounding the display panel, the heat sink plate, the camera module, and the moving member.

23. The display device of claim 1, wherein the sub-pixel structure includes:
a semiconductor element on the first substrate;
a lower electrode on the semiconductor element;
a light emitting layer on the lower electrode; and
an upper electrode on the light emitting layer.

24. The display device of claim 23, wherein the upper electrode does not cover the transparent region.

25. The display device of claim 23, wherein the semiconductor element includes:
an active layer on the first substrate, the active layer including source and drain regions;
a gate electrode on the active layer;
a source electrode on the gate electrode, the source electrode being in contact with the source region of the active layer; and
a drain electrode spaced apart from the source electrode, the drain electrode being in contact with the drain region of the active layer.

26. The display device of claim 25, wherein the semiconductor element further includes:
a gate insulation layer on the first substrate, the gate insulation layer covering the active layer in the sub-pixel region but not the transparent region;
an insulating interlayer on the gate insulation layer, the insulating interlayer covering the gate electrode in the sub-pixel region while being absent from the transparent region; and
a planarization layer on the insulating interlayer, the planarization layer covering the source and drain electrodes in the sub-pixel region, the planarization layer not covering the transparent region.

27. The display device of claim 26, wherein the gate insulation layer, the insulating interlayer, and the planarization layer do not cover a portion of the first substrate in the transparent region to form a transparent window in the transparent region.

28. The display device of claim 25, wherein the semiconductor element further includes:
a gate insulation layer covering the active layer in the sub-pixel region, the gate insulation layer in the sub-pixel region and the transparent region on the first substrate;
an insulating interlayer covering the gate electrode in the sub-pixel region, the insulating interlayer in the sub-pixel region and the transparent region on the gate insulation layer; and
a planarization layer on the insulating interlayer, the planarization layer covering the source and drain electrodes in the sub-pixel region, the planarization layer exposing the insulating interlayer in the transparent region.

29. The display device of claim 25, wherein the semiconductor element further includes:
a gate insulation layer covering the active layer in the sub-pixel region, the gate insulation layer in the sub-pixel region and the transparent region on the first substrate;
an insulating interlayer covering the gate electrode in the sub-pixel region, the insulating interlayer in the sub-pixel region and the transparent region on the gate insulation layer; and
a planarization layer covering the source and drain electrodes in the sub-pixel region, the planarization layer in the sub-pixel region and the transparent region on the insulating interlayer.

30. The display device of claim 1, wherein the heat sink plate further comprises:
a tab including a first portion that is connected to the heat sink plate and a second portion spaced apart from the heat sink plate, the tab having a circular shape.

31. The display device of claim 1, wherein at least a portion of the camera module is positioned in the opening of the heat sink plate.

32. A display device comprising:
a display panel including a sub-pixel region, a transparent region, and a reflection region;
a camera module coupled to a back side of the display panel and aligned with the transparent region to capture an image of an object in front of the display panel, and
a transflective reflection pattern overlapping with the sub-pixel region and the reflection region, wherein the transflective reflection pattern is configured to, in the sub-pixel region, both reflect a portion of a light and transmit another portion of the light, and configured to, in the reflection region, both reflect a portion of another light and transmit another portion of the another light.

33. The display device of claim 32 further comprising:
a heat sink plate positioned between the display panel and the camera module, the heat sink plate having an opening that is aligned with the transparent region and the camera module; and
an adhesive member between the display panel and the heat sink plate.

34. The display device of claim 32 wherein the transflective reflection pattern covers an entire surface of the display panel.

35. A display device comprising:
a display panel having a plurality of pixel regions, each of the pixel regions including a sub-pixel region, a reflection region, and a transparent region;
a camera module coupled to a back side of the display panel; and
a moving member coupled to the camera module to move the camera module into different pixel regions and align the camera module with the transparent region of a selected pixel region.

36. The display device of claim 35 further comprising a heat sink plate disposed between the display panel and the camera module, the heat sink plate having a plurality of openings that are aligned with transparent regions of the pixel regions, such that the camera module captures an image of an object in front of the display panel from more than one pixel regions of the display panel.

* * * * *